United States Patent [19]
Ishikawa

[11] Patent Number: 5,841,185
[45] Date of Patent: *Nov. 24, 1998

[54] SEMICONDUCTOR DEVICE HAVING CMOS TRANSISTORS

[75] Inventor: Akio Ishikawa, Tokyo, Japan

[73] Assignee: Nippon Steel Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 601,799
[22] Filed: Feb. 15, 1996

[30] Foreign Application Priority Data

Feb. 17, 1995 [JP] Japan .................................. 7-053247
Feb. 2, 1996 [JP] Japan .................................. 8-040504

[51] Int. Cl.⁶ .................................................. H01L 23/58
[52] U.S. Cl. ........................... 257/630; 257/372; 257/394
[58] Field of Search ................................ 257/630, 394, 257/372, 629, 373, 401

[56] References Cited

U.S. PATENT DOCUMENTS

| 5,164,803 | 11/1992 | Ozaki et al. | 257/630 |
| 5,181,094 | 1/1993 | Eimori et al. | 257/630 |
| 5,463,238 | 10/1995 | Takahashi et al. | 257/630 |
| 5,498,898 | 3/1996 | Kawamura | 257/630 |
| 5,510,638 | 4/1996 | Lancaster et al. | 257/394 |
| 5,521,419 | 5/1996 | Wakamiya et al. | 257/394 |

FOREIGN PATENT DOCUMENTS 60-169163A 9/1985 Japan .
2-168666 6/1990 Japan .

OTHER PUBLICATIONS

Wakayima et al., Fully Planarized 0.5um Technologies for 16M DRAM, IEDM88, 1988, IEEE pp. 246–249.

Primary Examiner—Sara W. Crane
Attorney, Agent, or Firm—Pollock, Vande Sande & Priddy

[57] ABSTRACT

A semiconductor device comprises a semiconductor substrate having N- and P-channel regions formed therein; a plurality of first transistors formed in the N-channel region; a first field shield element-isolation structure having a first shield plate electrode and formed in the N-channel region for isolating the first transistors from each other; a plurality of second transistors formed in the P-channel region; and a second field shield element-isolation structure having a second shield plate electrode electrically connected to the first shield plate electrode and formed in the P-channel region for isolating the second transistors from each other; wherein respective values of a threshold voltage $V_{tN}$ of a parasitic transistor formed in a field region of the N-channel region, a threshold voltage $V_{tP}$ of a parasitic transistor formed in a field region of the P-channel region and a potential $V_{sP}$ of the first or second shield plate electrode are determined so as to meet $V_{tN}-V_{tP}>V_{cc}-V_{ss}$ and $V_{tN}>V_{sP}-V_{ss}>V_{tP}+V_{cc}-V_{ss}$, where $V_{ss}$ is a potential of the source of the first transistor, $V_{cc}$ is a potential of the source of the second transistor and $V_{cc}>V_{ss}$. Further, a method for manufacturing a semiconductor device as above-mentioned wherein the surface impurity concentration of at least one of the P-channel region and the N-channel region is determined by a desired threshold voltage of the MOS transistor formed in that region.

10 Claims, 19 Drawing Sheets

5,841,185

SEMICONDUCTOR DEVICE HAVING CMOS TRANSISTORS

BACKGROUND OF THE INVENTION

1. Field of the Invention

The present invention relates to a semiconductor device with a CMOS circuit and to a method for manufacturing the same, and more particularly to a semiconductor device having a CMOS circuit in which the elements are isolated by a field shield element-isolation structure and to a method for manufacturing the same.

2. Description of the Related Art

As the integration density of a semiconductor device has recently been increased, the application of a conventional element-isolation method by a LOCOS method to fine elements smaller than half micron becomes difficult due to problems of a bird beak and a narrow channel effect by lateral diffusion of impurities from a channel stopper layer. A field shield element-isolation method has widely been used in place of the LOCOS method.

In the field shield element-isolation method, a shield plate electrode formed on a shield gate insulation film is fixed to a ground (GND) potential to prevent the effect of a potential from a wiring layer passing above the shield plate electrode from being imparted to a substrate below the shield gate insulation film and to prevent the conduction of a parasitic MOS transistor.

The field shield element-isolation method is free from the problems of the bird beak and the narrow channel effect encountered in the conventional LOCOS method and is suitable for microminiaturization.

For example, "Fully planarized 0.5 $\mu$m technologies for 16M DRAM" IDEM-88, 1988, IEEE, pp. 246–249, Waka-miya et al, reports that a good element-isolation characteristic was attained by applying the field shield element-isolation method to 16M DRAM.

In the past, when the above field shield element-isolation method was applied to a complementary MOS (CMOS) circuit, it was necessary that a shield plate potential used for the separation of N-channel elements and a shield plate potential used for the separation of P-channel elements were different from each other. For example, in a CMOS inverter, since a source potential of an N-channel MOS transistor is set to a ground potential ($V_{ss}$) and a source potential of a P-channel MOS transistor is set to a power supply potential ($V_{cc}$) for driving, the shield plate potential is fixed to the ground potential ($V_{ss}$) for the separation of the N-channel devices and the shield plate potential is fixed to the power supply potential ($V_{cc}$) for the separation of the P-channel devices. In the prior art complementary semiconductor device as shown in JP-A-2-168666, when the same shield plate potential is used for the N-channel region and the P-channel region, there is no guarantee that a parasitic MOS transistor does not conduct in any of the regions, and hence different shield plate potentials are used for the N-channel region and the P-channel region.

However, in order to change the shield plate potential between the N-channel region and the P-channel region, it is necessary to isolate the shield plate electrodes in the respective regions and provide respective contact structures for separate wiring layers to control the respective potentials. As a result, the field shield element-isolation structure is complex and the space needed therefor increases.

When the field shield element-isolation method is applied to the CMOS circuit, an effective element-insolation width is large even if a potential of the shield plate electrode at a boundary region between the N-channel region and the P-channel region is fixed to either the ground potential ($V_{ss}$) or the power supply potential ($V_{cc}$) and a high integration density of the semiconductor device is hardly attained. This will be explained with reference to FIGS. 13 and 14.

FIG. 13 shows a plan view of a CMOS inverter circuit and FIG. 14 shows a sectional view taken along a line XIV—XIV of FIG. 13. In those figures, a P well (N-channel region) 202 and an N well (P-channel region) 203 are formed on a surface of a silicon substrate 201, and an N-channel MOS (NMOS) transistor 251 and a P-channel MOS (PMOS) transistor 252 are formed in the P well 202 and the N well 203, respectively.

The NMOS transistor 251 comprises a gate electrode 204 formed on the P well 202 with a gate oxide film (not shown) being interposed therebetween and a pair of impurity diffusion layers 205 and 206, which serve as a source and a drain, (in the following description, the source is designated as 205 and the drain is designated as 206) formed in a surface of the P well 202 on both sides of the gate electrode 204. The PMOS transistor 252 comprises a gate electrode 207 formed on the N well 203 with a gate oxide film (not shown) being interposed therebetween and a pair of impurity diffusion layers 208 and 209, which serve as a source and drain, (in the following description, the source is designated as 208 and the drain is designated as 209) formed in a surface of the N well 203 on the opposite sides of the gate electrode 207.

The two gate electrodes 204 and 207 are connected together by an upper layer of an aluminum wiring 231 and the two drains 206 and 209 are also connected together by an upper layer of an aluminum wiring 232. The source 205 is connected to a ground terminal ($V_{ss}$, not shown) by an aluminum wiring 233 formed on an interlayer insulation film 211 through a source contact 212 and through a P-type impurity diffusion layer 253. The source 208 is connected to a power supply terminal ($V_{cc}$, not shown) by an aluminum wiring 234 and through an N-type impurity diffusion layer 254. An interlayer insulation film 212 is formed on the aluminum wirings 233 and 234.

The NMOS transistor 251 is electrically isolated from adjacent transistors (not shown) by a shield plate electrode 223 fixed to the ground potential ($V_{ss}$) and the PMOS transistor 252 is electrically isolated from adjacent transistors (not shown) by a shield plate electrode 224 fixed to the power supply potential ($V_{cc}$). The shield plate electrodes 223 and 224 are formed on the shield gate insulation film 221 and covered by a cap insulation film 225 and a side-wall insulation film 226.

When the potential of the shield plate electrode 222 formed at the boundary region between the P well 202 and the N well 203 across the both wells with the shield gate insulation film 221 being interposed therebetween is fixed to the power supply potential ($V_{cc}$), an inversion layer is formed in a region (region a in FIG. 14) under the shield plate electrode 222 in the surface of the P well 202 so that the width of the region a is excluded from an effective separation width between the source/drain 205 or 206 of the NMOS transistor 251 and the N well 203. Namely, the effective isolation width is a distance from a right end of the source/drain 205 or 206 of the NMOS transistor 251 to a right end of the impurity diffusion region 253 (region c in FIG. 14). Accordingly, in order to attain sufficient isolation, it is necessary to increase the width of the region c to increase the effective isolation width.

On the other hand, when the potential of the shield plate electrode 222 is fixed to the ground potential ($V_{ss}$), an inversion layer is formed in a region (region b in FIG. 14) below the shield plate electrode 222 in the surface of the N well 203 so that the width of the region b is excluded from an effective separation width between the source/drain 208 or 209 of the NMOS transistor 252 and the P well 202. Namely, the effective isolation width is a distance from a left end of the source/drain 208 or 209 of the PMOS transistor 252 to a left end of the impurity diffusion layer 254 (region d in FIG. 14). Accordingly, in order to attain sufficient isolation, it is necessary to increase the width of the region d to increase the effective isolation width.

When an electrical isolation is to be provided at the boundary region between the P well 202 and the N well 203, a part of the P well 202 or the N well 203 below the shield plate electrode 222 is inverted even if the potential of the shield plate electrode 222 formed on the boundary region is fixed to either the ground potential ($V_{ss}$) or the power supply potential ($V_{cc}$). Thus, in order to increase the effective isolation width to assure the element-isolation, it is necessary to increase the regions c and d adjacent to the shield plate electrode 222. This will impede the high integration density in the semiconductor device.

SUMMARY OF THE INVENTION

An object of the invention is to provide a semiconductor device with a CMOS circuit formed on a semiconductor substrate having N- and P-channel regions wherein elements constituting the CMOS circuit are electrically isolated from each other by a field shield element-isolation structure. A shield plate of the field-shield element-isolation structure disposed in the P-channel region has an electrical potential substantially equal to that of a shield plate of the field shield element-isolation structure disposed in the N-channel region so that the area occupied by the field shield element-isolation structure can be made smaller.

Another object of the invention is to provide a semiconductor device with a CMOS circuit formed on a semiconductor substrate having N- and P-channel regions wherein elements constituting the CMOS circuit are electrically isolated from each other by a field shield element-isolation structure. An inversion layer is prevented from being formed at a surface area of the substrate disposed below a part of the element-isolation structure formed at a boundary between the P- and N-channel regions so that a separation width between transistors formed in the P- and N-channel regions, respectively, can be made substantially smaller.

A still further object of the invention is to provide a method for manufacturing a semiconductor device as above-mentioned.

In order to achieve the above object, according to one aspect of the invention, a semiconductor device comprises a semiconductor substrate having N- and P-channel regions formed therein; a plurality of first transistors formed in said N-channel region and each having a drain and a source; a first field shield element-isolation structure having a first shield plate electrode and formed in the N-channel region for isolating the first transistors from each other; a plurality of second transistors formed in the P-channel region and each having a drain and a source; a second field shield element-isolation structure having a second shield plate electrode electrically connected to the first shield plate electrode and formed in the P-channel region for isolating the second transistors from each other.

The respective values of a threshold voltage $V_{tN}$ of a parasitic transistor formed in a field region of the N-channel region where the first field shield element-isolation structure is formed, a threshold voltage $V_{tP}$ of a parasitic transistor formed in a field region of the P-channel region where the second field shield element-isolation structure is formed and a potential $V_{sP}$ of the first shield plate electrode electrically connected to the second shield plate electrode are determined so as to meet:

$$V_{tN} - V_{tP} > V_{cc} - V_{ss}$$

$$V_{tN} > V_{sP} - V_{ss} > V_{tP} + V_{cc} - V_{ss}$$

where $V_{ss}$ is a potential of the source of each of the first transistors, $V_{cc}$ is a potential of the source of each of said second transistors and $V_{cc} > V_{ss}$.

In one embodiment of the present invention, $V_{tN}$ and $V_{tP}$ are controlled by the surface impurity concentration of the respective field regions of the N- and P-channel regions.

In another embodiment of the present invention, $V_{tN}$ and $V_{tP}$ are controlled by the film thickness of the oxide films in the respective field regions of the N- and the P-channel regions.

According to another aspect of the invention, a semiconductor device comprises a semiconductor substrate having N- and P-channel regions formed therein; at least one first transistor formed in the N-channel region has a drain and a source and at least one second transistor formed in the P-channel region has a drain and a source. A field shield element-isolation structure having a shield plate electrode is formed at a boundary region between the P- and N-channel regions for isolating the first transistor from the second transistor.

Assuming that a potential of the source of the first transistor is a first reference potential $V_{ss}$ and a potential of the source of the second transistor is a second reference potential $V_{cc}$ larger than $V_{ss}$, respective values of a first potential $V_{tN}$ of the shield plate electrode, as viewed from the first reference potential $V_{ss}$ when an inversion layer is formed in an area of said N-channel region below the shield plate electrode, and a second potential $V_{tP}$ of the shield plate electrode as viewed from the second reference potential $V_{cc}$ when an inversion layer is formed in an area of the P-channel region below the shield plate electrode, are determined so as to meet:

$$V_{tN} - V_{tP} > V_{cc} - V_{ss}$$

and a potential $V_{sP}$ of the shield plate electrode is determined by using the above-determined values of $V_{tN}$ and $V_{tP}$ so as to meet:

$$V_{tN} > V_{sP} - V_{ss} > V_{tP} + V_{cc} - V_{ss}.$$

In another embodiment of the present invention, $V_{tN}$ and $V_{tP}$ are controlled by the impurity concentrations of the N-channel region and the P-channel region.

In another embodiment of the present invention, $V_{tN}$ is controlled by making the surface impurity concentration of an area of the N-channel region below the shield plate electrode formed on the boundary area higher than the impurity concentration of another area of the N-channel region other than that below the shield plate electrode.

In another embodiment of the present invention, $V_{tP}$ is controlled by making the surface impurity concentration of an area of the P-channel region below the shield plate electrode formed on the boundary area higher than the impurity concentration of another area of the P-channel region other than that below the shield plate electrode.

In another embodiment of the present invention, $V_{tN}$ is controlled by making the surface impurity concentration of an area of the N-channel region below the shield plate electrode formed on the boundary area higher than the impurity concentration of another area of the N-channel region other than that below the shield plate electrode. $V_{tP}$ is controlled by making the surface impurity concentration of an area of the P-channel region below the shield plate electrode formed on the boundary area higher than the impurity concentration of another area of the P-channel region other than that below the shield plate electrode.

In another embodiment of the present invention, the shield plate electrode of the field shield element-insolation structure is formed continuously on the N-channel region and the P-channel region.

In another embodiment of the present invention, $V_{cc}$ is a power supply voltage and $V_{ss}$ is a ground potential.

In accordance with another aspect of the present invention, there is provided a method for manufacturing a semiconductor device comprising the steps of: forming an N-channel region and a P-channel region in a surface of a semiconductor substrate; forming an impurity diffusion layer by introducing impurity in at least one end area of said N-channel region close to the P-channel region and an end area of the P-channel region close to the N-channel region; forming a field shield element-isolation structure having a shield plate electrode on a boundary area between the N-channel region and the P-channel region; and forming at least one N-channel MOS transistor in the P-channel region and at least one P-channel MOS transistor in the N-channel region.

In one embodiment of the present invention, in the step of forming the impurity diffusion layer, the impurity is used to control a threshold voltage of at least one of the N-channel MOS transistor and the P-channel MOS transistor.

In another embodiment of the present invention, in the step of forming the impurity diffusion layer, the impurity is introduced by ion implantation.

In the semiconductor device of the present invention, the value $V_{tN}$ of the threshold voltage of a parasitic MOS transistor in the N-channel region (or the potential of the shield plate electrode formed on the boundary region measured with respect to the first reference potential when the inversion layer is formed in an area of the N-channel region below the shield plate electrode formed on the boundary region between the N-channel region and the P-channel region) and the value $V_{tP}$ of the threshold voltage of the parasitic MOS transistor in the P-channel region (or the potential of the shield plate electrode formed on the boundary region measured with respect to the second reference potential when the inversion layer is formed in an area of the P-channel region below the shield plate electrode formed in the boundary region between the N-channel region and the P-channel region) are determined to meet the relation of $V_{tN} - V_{tP} > V_{cc} - V_{ss}$. Thus, by setting the potential $V_{sP}$ of the shield plate electrode to meet the relation of $V_{tN} > V_{sP} - V_{ss} > V_{tP} + V_{cc} - V_{ss}$, the formation of the inversion layer in any region and the conduction of the parasitic MOS transistor are prevented.

Further, when at least one of $V_{tN}$ and $V_{tP}$ is controlled by the surface impurity concentration of an area of at least one of the N-channel region and the P-channel region below the shield plate electrode formed on the boundary region between the N-channel region and the P-channel region, it is not necessary to increase the impurity concentrations of the areas of the N-channel region other and the P-channel region than those below the shield plate electrode formed in the boundary region, so that the MOS transistor is operable at a high speed without unduly increasing the threshold voltage of the MOS transistor and the junction breakdown voltage can be improved.

Further, when the threshold voltage of at least one of the N-channel MOS transistor and the P-channel MOS transistor is controlled by the impurity introducing process for controlling at least one of $V_{tN}$ and $V_{tP}$, the impurity introduction may be conducted to control at least one of $V_{tN}$ and $V_{tP}$ without increasing the number of steps.

DESCRIPTION OF THE PREFERRED EMBODIMENTS

Figure 1:
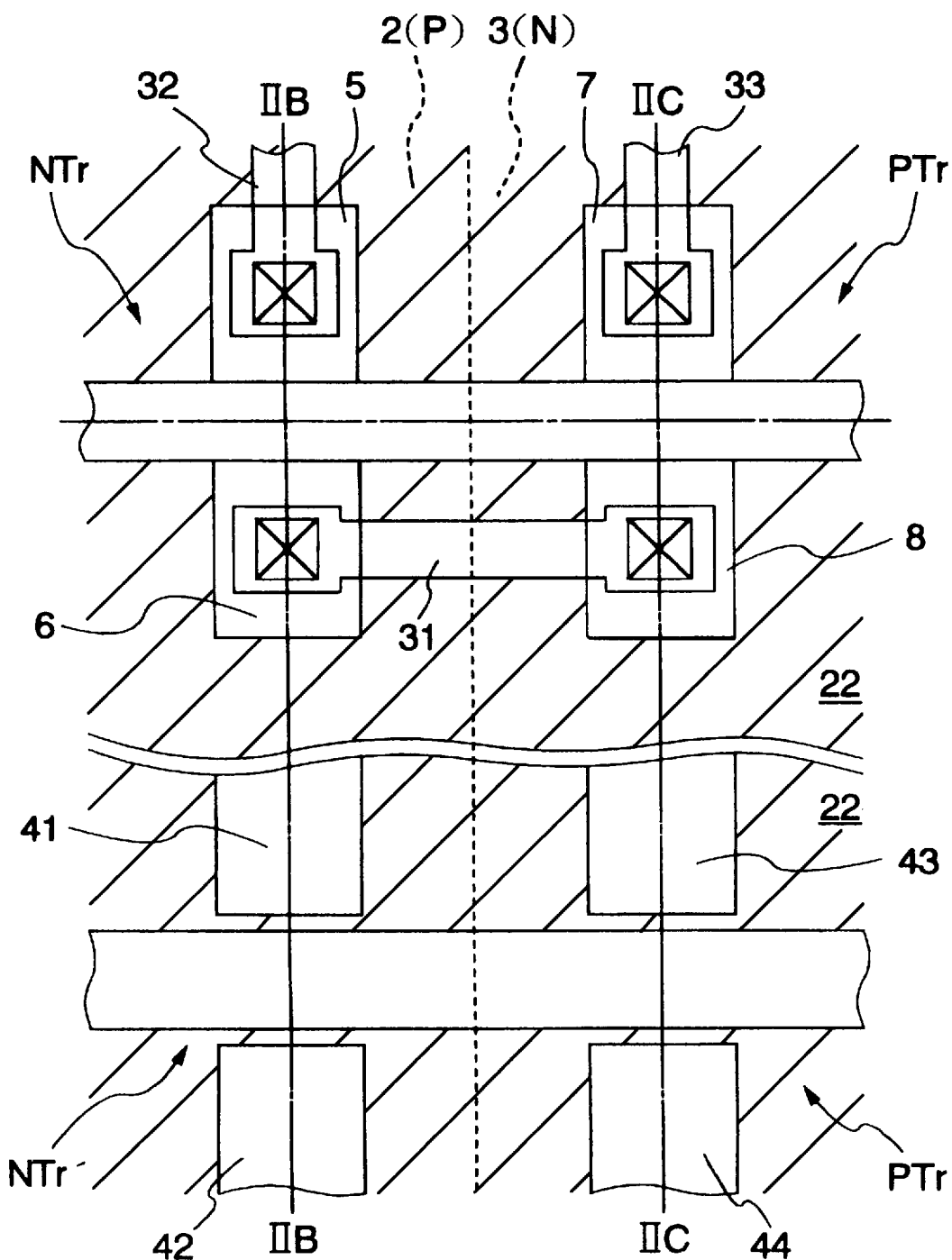
FIG. 1 shows a plan view of a CMOS semiconductor device in accordance with a first embodiment of the present invention.
Figure 2A:
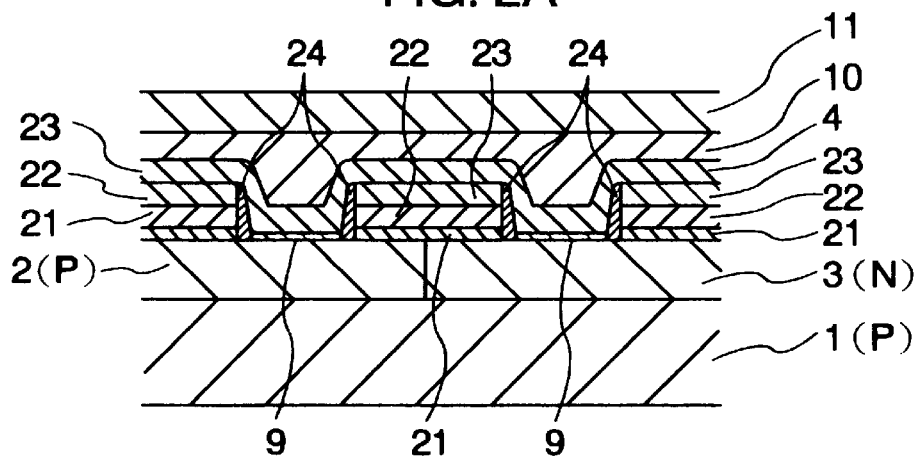
FIGS. 2A–2C show sectional views taken along IIA—IIA, IIB—IIB and IIC—IIC of FIG. 1, respectively.
Figure 2B:
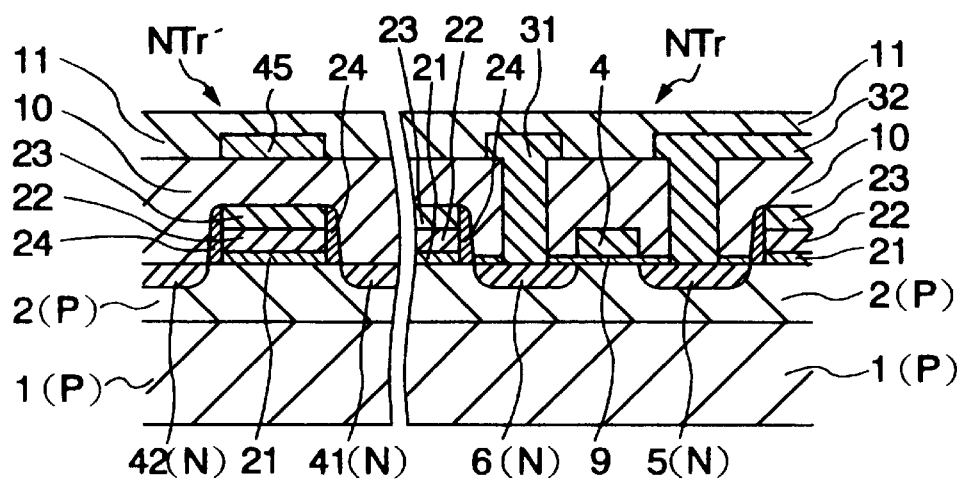
Figure 2C:
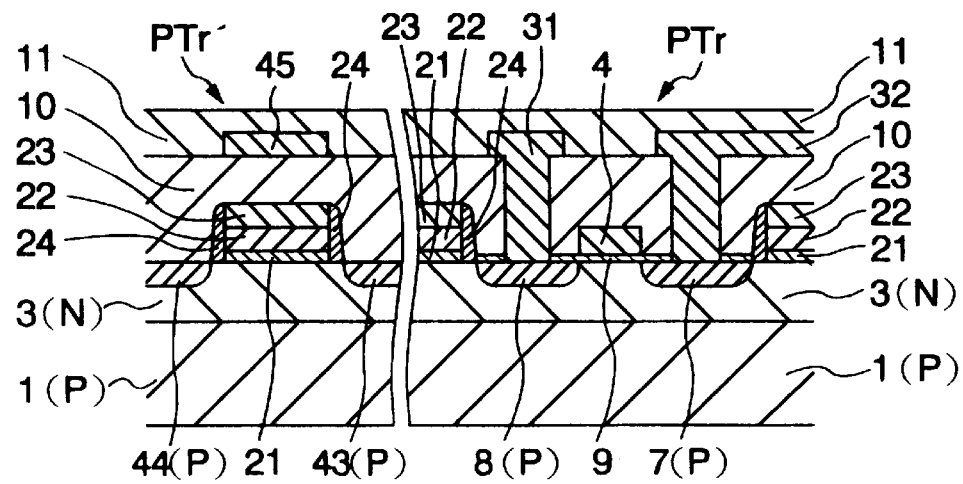

FIG. 1 shows a plan view of the major parts of a CMOS semiconductor device in accordance with a first embodiment of the present invention, FIGS. 2A, 2B and 2C show sectional views taken along IIA—IIA, IIB—IIB and IIC—IIC in FIG. 1, respectively.

Figure 3:
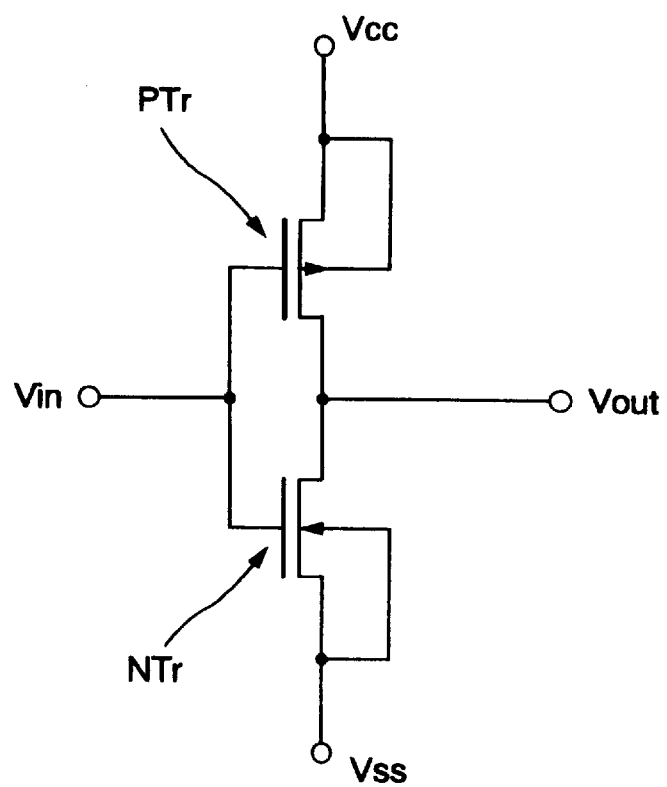
FIG. 3 shows a CMOS inverter circuit.

As shown in FIG. 2A, a P well (N-channel region) 2 and an N well (P-channel region) 3 are formed on a surface area of a P-type silicon substrate 1. As shown in FIGS. 1, 2B and 2C, an N-channel MOS transistor NTr is formed in the P well 2 and a P-channel MOS transistor PTr is formed in the N well 3 to form a CMOS inverter. A gate 4 is formed in common to the transistors NTr and PTr and a drain 6 of the N-channel MOS transistor NTr and a drain 8 of the P-channel MOS transistor PTr are interconnected by an aluminum wiring 31. A source 5 of the N-channel MOS transistor NTr is connected to a ground terminal ($V_{ss}$, not shown) through an aluminum wiring 32, and a source 7 of the P-channel MOS transistor PTr is connected to a power supply terminal ($V_{cc}$, not shown) through an aluminum wiring 33. Numeral 9 denotes a gate insulation film and numerals 10 and 11 denote interlayer insulation films. An equivalent circuit of the CMOS inverter is shown in FIG. 3.

As shown in FIGS. 2A–2C, the element-isolation is attained by the field shield element-isolation structure. Namely, a shield plate electrode 22 is formed on a field region surrounding an area in which the NMOS or PMOS transistor is to be formed in each of the wells 2 and 3 and the shield plate electrode 22 is covered by a cap insulation film 23 and a sidewall insulation film 24. In the present embodiment, as shown in FIGS. 1 and 2A, the shield plate electrode 22 is formed to be continuous in the field region on the P well 2 and the field region on the N well 3.

FIGS. 1, 2B and 2C show parasitic MOS transistors formed in the N-channel region and the P-channel region, respectively. As shown in FIGS. 1 and 2B, a parasitic MOS transistor NTr' is formed in the N-channel region of the P well 2 to have N-type impurity diffusion layers 41 and 42, which are the source or drain of two adjacent N-channel MOS transistors, not shown, as a source and a drain thereof and a wiring layer (bit wiring or gate wiring) 45 passing above the field region as a gate thereof. Also, as shown in FIGS. 1 and 2C, a parasitic MOS transistor PTr' is formed in the P-channel region of the N well to have P-type impurity diffusion layers 43 and 42, which are the source or drain of two adjacent P-channel MOS transistors, not shown, as a source and a drain thereof and a wiring layer 45 passing above the field region as a gate thereof.

Referring to FIGS. 4A–4F, a method for manufacturing the CMOS structure described above is explained.

In each of FIGS. 4A–4F, a sectional view of a boundary region between the P well 2 and the N well 3 corresponding to FIG. 2A is shown on the left-half, and a sectional view corresponding to the portion of the P-channel MOS transistor PTr of FIG. 2C is shown on the right-half.

Figure 4A:
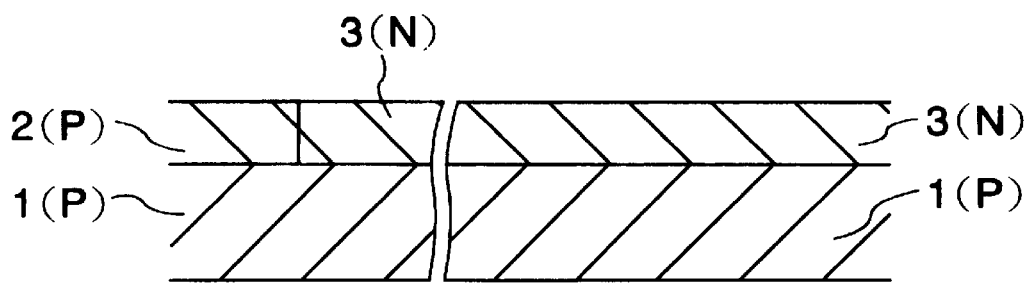
FIGS. 4A–4F show sectional views in the respective steps of a method for manufacturing the CMOS semiconductor device of the first embodiment of the present invention.

First, as shown in FIG. 4A, an impurity such as boron, is ion-implanted into the region of the P-type silicon substrate 1, in which the P well 2 is to be formed, at an implantation energy of 60 KeV and dose of $1 \times 10^{13} cm^{-2}$ and phosphorus is ion-implanted into the region in which the N well 3 is to be formed at an implantation energy of 150 KeV and dose of $1 \times 10^{13} cm^{-2}$. Then, the impurities are diffused and activated by a thermal process at a temperature of 1100° C. for 6 hours to form the P well 2 and the N well 3, respectively.

Figure 4B:
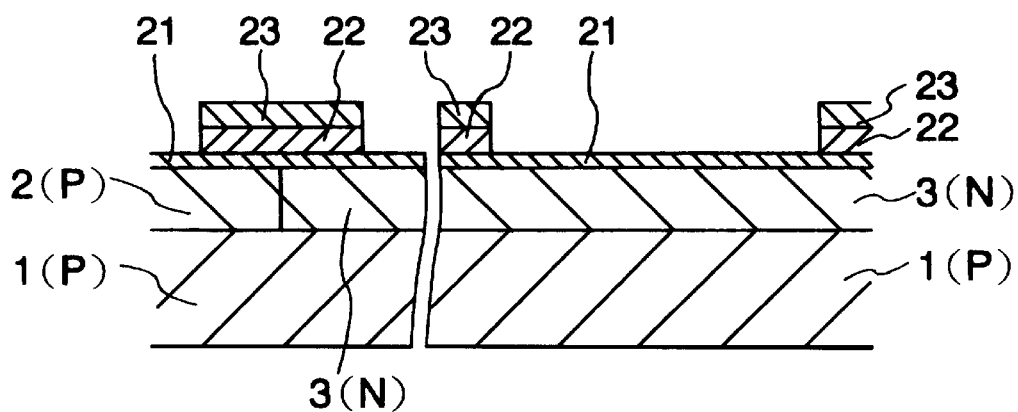

Then, as shown in FIG. 4B, the surface of the silicon substrate 1 having the wells 2 and 3 formed therein is thermally oxidized to form the shield gate insulation film 21 having a film thickness of approximately 50 nm. The polysilicon film 22 having a film thickness of approximately 200 nm is formed on the shield gate insulation film 21 by a CVD method. Phosphorus is thermally diffused to the polysilicon film 22 to lower its resistance and the silicon oxide film 23, having a film thickness of approximately 250 nm, is formed on the polysilicon film 22 by the CVD method. Then, by using a photoresist as a mask (not shown), predetermined portions of the silicon oxide film 23 and the polysilicon film 22 are removed by etching, and the cap insulation film 23 and the shield plate electrode 22 are formed in a predetermined pattern.

Figure 4C:
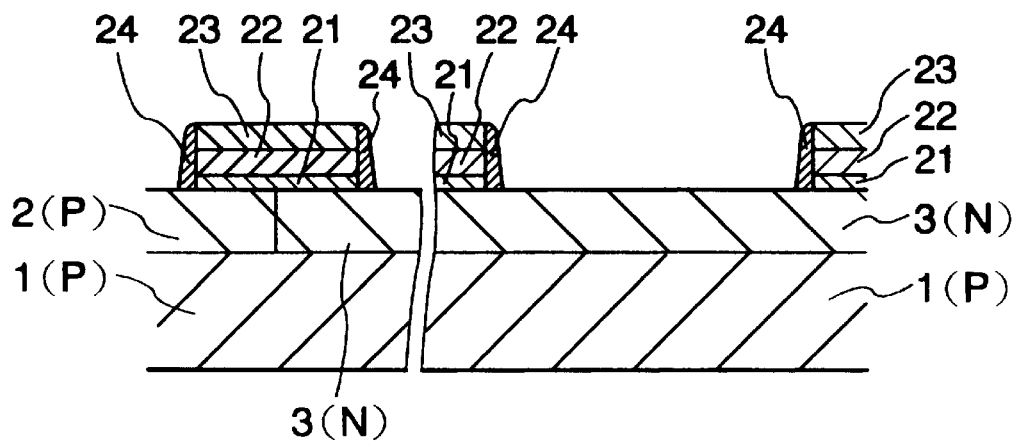

Next, as shown in FIG. 4C, a silicon oxide film having a film thickness of approximately 200 nm is formed on the entire surface by the CVD method and the silicon oxide film 24 is etched back by anisotropic dry etching to form the sidewall insulation films 24 on the opposite sides of the shield plate electrode 22. As shown, the shield gate insulation film 21 in the element region is also etched away.

Figure 4D:
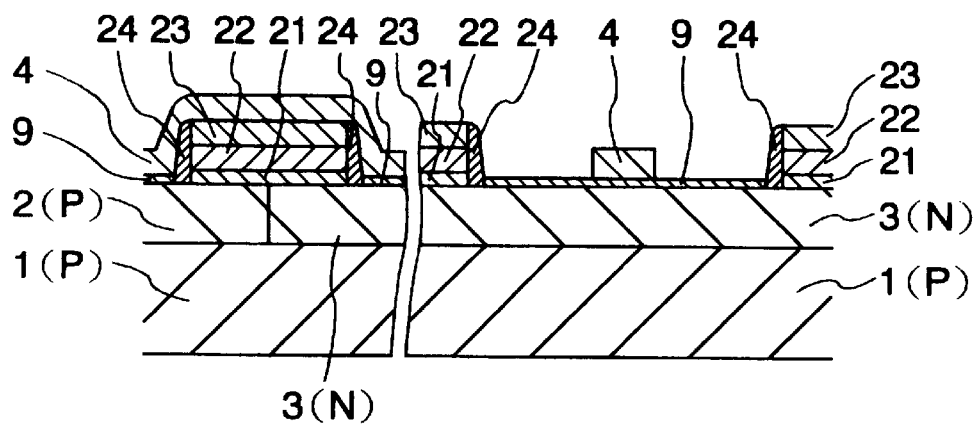

Then, as shown in FIG. 4D, the surface of the silicon substrate 1 in the exposed element region is thermally oxidized to form the gate insulation film 9 having a film thickness of approximately 15 nm. Then, a polysilicon film having a film thickness of approximately 200 nm is formed on the gate insulation film 9 by the CVD method. Phosphorus is thermally diffused to the polysilicon film to lower its resistance and predetermined portions of the polysilicon film are removed by etching using a photoresist mask (not shown) to form the gate 4 of a predetermined pattern.

Figure 4E:
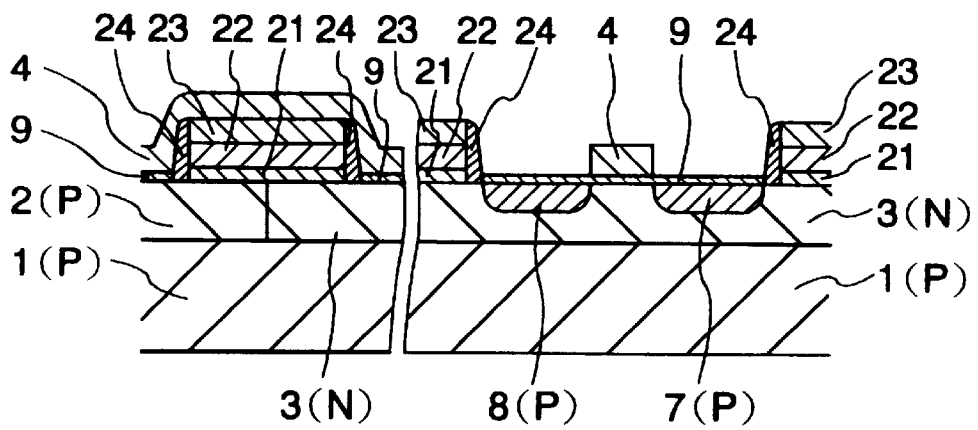

Then, as shown in FIG. 4E, by using the pattern of the gate 4 and the field shield element-insolation structure as a mask, arsenic is ion-implanted into the P well 2 at an implantation energy of 60 KeV and dose of $5 \times 10^{15} cm^{-2}$ and boron difluoride is ion-implanted into the N well 3 at an implantation energy of 40 KeV and dose of $5 \times 10^{15} cm^{-2}$. Then, thermal process is applied to form impurity diffusion layers 5–8 (41–44) which serve as source/drains in the respective regions.

Figure 4F:
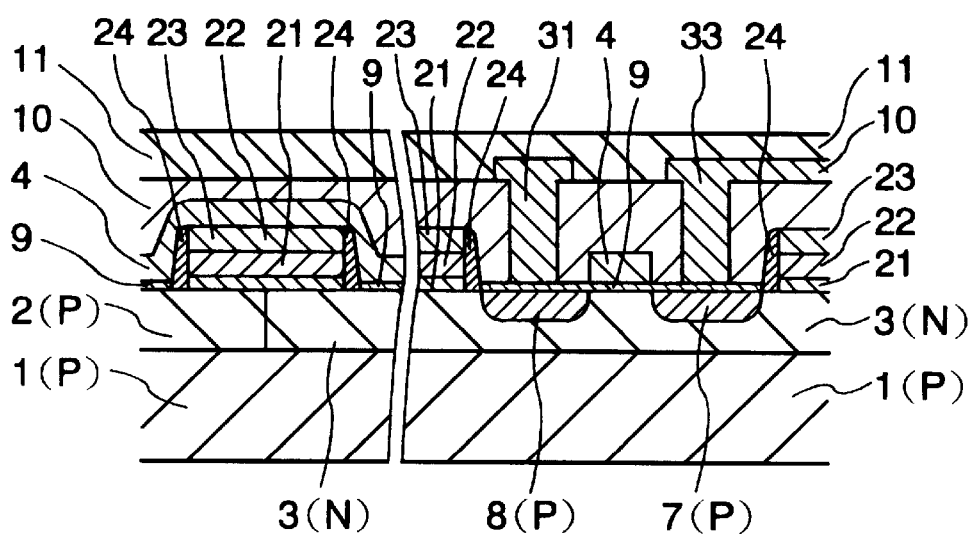

Then, as shown in FIG. 4F, a silicon oxide film, which serves as the first interlayer insulation film 10, is formed on the entire surface by the CVD method, a contact hole is formed in a predetermined portion of the first interlayer insulation film 10, aluminum wrings 31–33 (45) are patterned by a sputtering method and a fine work technique, and a silicon oxide film which serves as the second interlayer insulation film 11 is formed by the CVD method.

An operation of the CMOS inverter shown in FIG. 3 is briefly explained.

When an input signal $V_{in}$ is at a low ("L") level (=$V_{ss}$=0), the P-channel MOS transistor PTr is conductive and the N-channel MOS transistor NTr is non-conductive, and $V_{cc}$ of a high ("H") level is produced as an output signal $V_{out}$. When the input signal $V_{in}$ is at the "H" level (=$V_{cc}$), the P-channel MOS transistor PTr is non-conductive and the N-channel MOS transistor NTr is conductive so that $V_{ss}$ (="L" level) is produced as the output signal $V_{out}$.

A potential of the shield plate electrode 22 in the present embodiment is explained hereinafter.

It is assumed that a threshold voltage of the parasitic transistor NTr' in the N-channel region shown in FIGS. 1 and 2B is $V_{tN}$ and a threshold voltage of the parasitic MOS transistor PTr' in the P-channel region shown in FIGS. 1 and 2C is $V_{tP}$. In the CMOS device of the present embodiment, those threshold voltages $V_{tN}$ and $V_{tP}$ are controlled by the surface impurity concentrations of the P well 2 and the N well 3 so as to meet $V_{tN}-V_{tP}>V_{cc}$ (when $V_{ss} \neq 0$, $V_{cc}$ is substituted by $V_{cc}-V_{ss}$). Thus, when a potential $V_{sP}$ which meets $V_{tN}>V_{sP}>V_{tP}+V_{cc}$ (when $V_{ss} \neq 0$, $V_{sP}$ is substituted by $V_{sP}-V_{ss}$ and $V_{tP}+V_{cc}$ is substituted by $V_{tP}+V_{cc}-V_{ss}$) is applied to the shield plate electrode 22 of the field shield element-isolation structure, no parasitic MOS transistor in any region is rendered conductive.

Specifically, when the power supply voltage $V_{cc}$=3.3 (V), $V_{tN}$ and $V_{tP}$ are controlled so as to meet $V_{tN}>2$ (V) and $V_{tP}<-2$ (V), and $V_{cc}/2$=1.65 (V) is applied to the shield plate electrode 22 as $V_{sP}$, the potential of the shield plate electrode 22 measured with respect to the N-type impurity diffusion layers 41 and 42, which serve as the source/drains of the parasitic MOS transistor NTr' in the N-channel region shown in FIGS. 1 and 2B, is $V_{sP}=1.65$ (V) ($<V_{tN}$), which can shield the potential of the wiring layer passing above so that the parasitic MOS transistor NTr' does not conduct. On the other hand, the potential of the shield plate electrode 22 as viewed from the P-type impurity diffusion layers 43 and 44 which serve as the source/drains of the parasitic MOS transistor PTr' in the P-channel region shown in FIGS. 1 and 2C, is $V_{sP}-V_{cc}=-1.65$ (V) ($>V_{tP}$), which can shield the potential of the wiring layer 45 passing above so that the parasitic MOS transistor PTr' does not conduct.

When $V_{tN}$ and $V_{tP}$ are controlled to meet $V_{tN}>V_{cc}$ and $V_{tP}<0$ (V), $V_{tP}=V_{cc}$ can be met, and when $V_{tN}$ and $V_{tP}$ are controlled to meet $V_{tN}>0$ (V) and $V_{tP}<-V_{cc}$, $V_{sP}=0$ (V) ($=V_{ss}$) can be met. Those threshold voltages $V_{tN}$ and $V_{tP}$ may be controlled to have desired values by adjusting the surface impurity concentrations in the respective regions, that is, by changing the doses and the conditions in ion-implantation for forming the P well 2 and the N well 3. Alternatively, separate processes for ion-implantation to the field regions may be provided.

The parasitic MOS transistors are usually controlled to meet $V_{tN}>0$ and $V_{tP}<0$ so that they are normally non-conductive. In the present embodiment, since the parasitic MOS transistors are rendered non-conductive by the potential of the shield plate electrode 22, it may be controlled to meet $V_{tN}\leq 0$ or $V_{tP}\geq 0$ by adjusting the surface impurity concentrations in the respective regions. Further, $V_{tN}$ and $V_{tP}$ may be controlled by the film thicknesses of the oxide films in the field regions of the N-channel region and the P-channel region.

A second embodiment of the present invention is now explained with reference to FIGS. 5–8.

Figure 5:
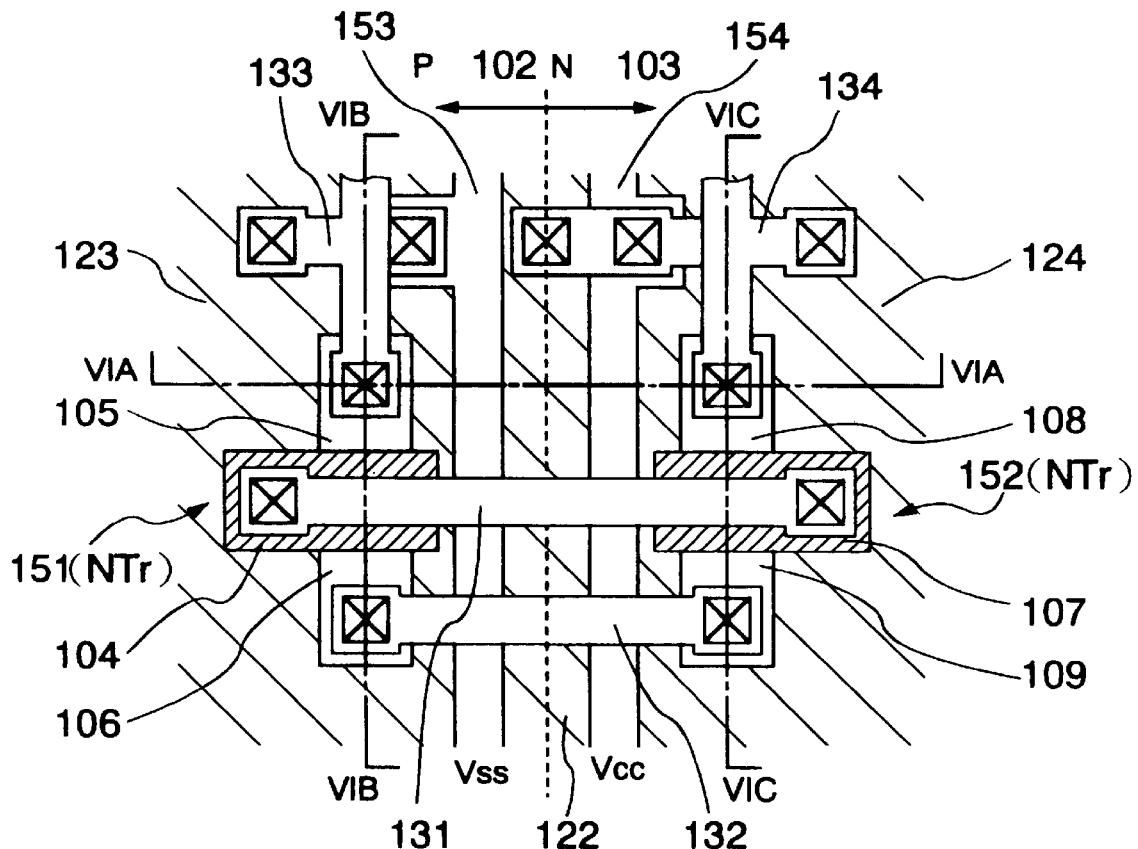
FIG. 5 shows a plan view of a CMOS semiconductor device in accordance with a second embodiment of the present invention.
Figure 6A:
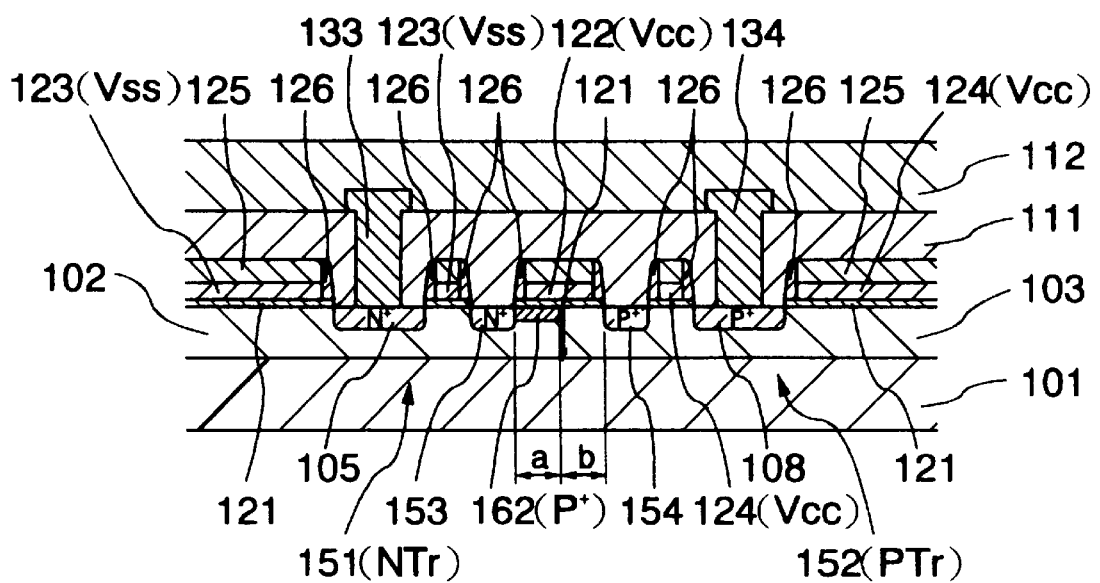
FIGS. 6A–6C show sectional views taken along VIA—VIA, VIB—VIB and VIC—VIC of FIG. 5, respectively.
Figure 6B:
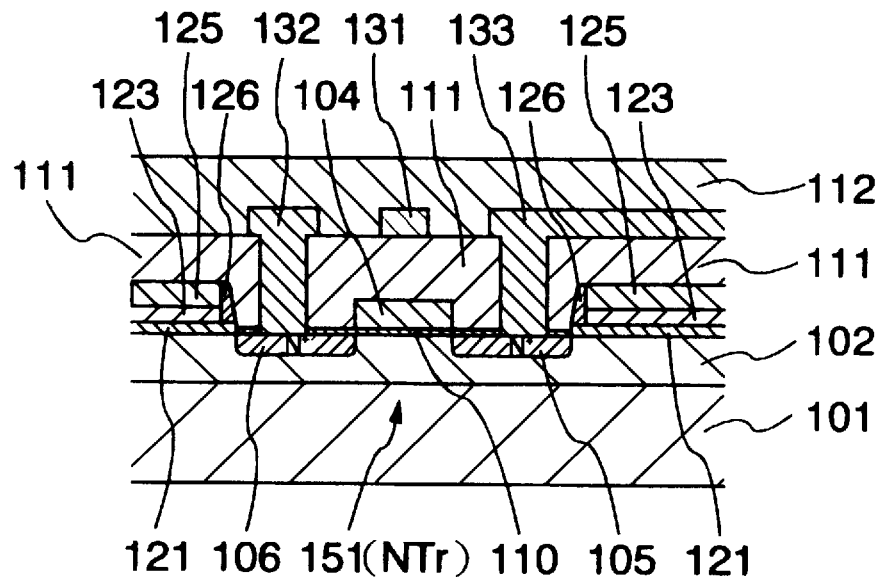
Figure 6C:
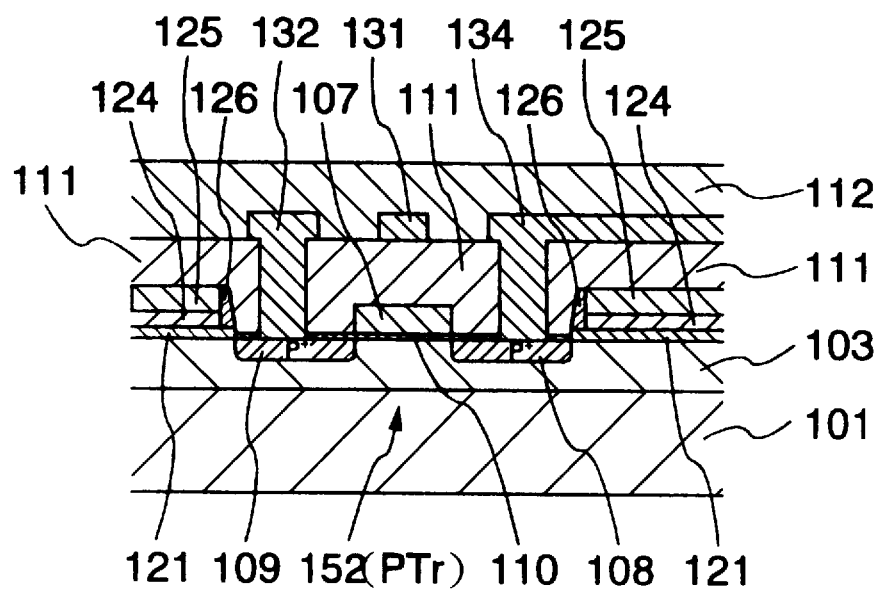

FIG. 5 shows a plan view of the CMOS inverter circuit of the present embodiment and FIGS. 6A, 6B and 6C show sectional views taken along VIA—VIA, VIB—VIB and VIC—VIC of FIG. 5. In those figures, a P well (N-channel region) 102 and an N well (P-channel region) 103 are formed on a surface area of a silicon substrate 101, and an N-channel MOS transistor (NMOS transistor) 151 is formed in the P well 102 and a P-channel MOS transistor (PMOS transistor) 152 is formed in the N well 103.

The NMOS transistor 151 comprises a gate electrode 104 formed on the P well 102 with a gate oxide film 110 being interposed therebetween and a pair of impurity diffusion layers 105 and 106 which serve as source/drains (hereinafter the source is designated as 105 and the drain is designated as 106) formed in the surface of the P well 102 at the opposite sides of the gate electrode 104. The PMOS transistor 152 comprises a gate electrode 107 formed on the N well 103 with the gate oxide film 110 being interposed therebetween and a pair of impurity diffusion layers which serve as source/drains (hereinafter the source is designated as 108 and the drain is designated as 109) formed in the surface of the N well 103 at the opposite sides of the gate electrode 107.

The two gate electrodes 104 and 107 are interconnected by an aluminum wiring 131 of an upper layer and the two drains 106 and 109 are interconnected by an aluminum wiring 132 of another upper layer. The source 105 is connected to a ground terminal ($V_{ss}$, not shown) through an aluminum wiring 133 formed on an interlayer insulation film 111 and the N-type impurity diffusion layer 153. The source 108 is connected to a power supply terminal ($V_{cc}$, not shown) through an aluminum wiring 134 and the P-type impurity diffusion layer 154. An interlayer insulation film 112 is formed on the aluminum wirings 133 and 134. An equivalent circuit of the CMOS inverter circuit is similar to that of FIG. 3 and the operation thereof is similar to that explained in the first embodiment.

As shown in FIGS. 5 and 6, the element-insolation is conducted by a field shield element-insolation structure. Namely, shield plate electrodes 122, 123 and 124 are formed on the field regions of the wells 102 and 103 with the shield insulation film 121 being interposed therebetween, and the shield plate electrodes 122, 123 and 124 are covered by a cap insulation film 125 and a sidewall insulation film 126. At a region (region a in FIG. 6A) below the shield plate electrode 122 in the surface of the P well 102, an impurity diffusion layer 162 is formed to include a P-type impurity, such as phosphorus or boron, at a higher concentration than in the other region of the P well. Such an impurity diffusion layer is not formed at a region (region b in FIG. 6A) below the shield plate electrode 122 in the surface of the N well and the impurity concentration of the region b is equal to that of the other region of the N well.

Referring to FIGS. 7A–7G, a manufacturing method of the CMOS structure described above is explained. In FIGS. 7A–7G, the left-half shows a sectional view of a boundary area between the P well 102 and the N well 103 corresponding to FIG. 6A and the right-half shows a sectional view corresponding to the portion of the P-channel MOS transistor PTr of FIG. 6C.

Figure 7A:
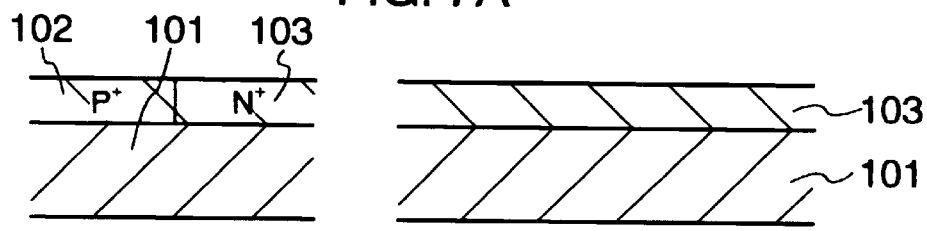
FIGS. 7A–7G show sectional views in the respective steps of a method for manufacturing the CMOS semiconductor device in the second embodiment of the present invention.

First, as shown in FIG. 7A, a region of the P-type silicon substrate in which the N well 103 is to be formed is masked by a photoresist. Boron is ion-implanted into a region in which the P well 102 is to be formed at an implantation energy of 60 KeV and dose of $1\times 10^{13} cm^{-2}$ and the photoresist is removed. Then, the region in which the P well is to be formed is masked by a photoresist and phosphorus is ion-implanted into the region in which the N well is to be formed at an implantation energy of 150 KeV and dose of $1\times 10^{13} cm^{-2}$. After the photoresist is removed, thermal process is applied at a temperature of 1100° C. for 6 hours to diffuse and activate the impurities thereby forming the P well 102 and the N well 103.

Figure 7B:
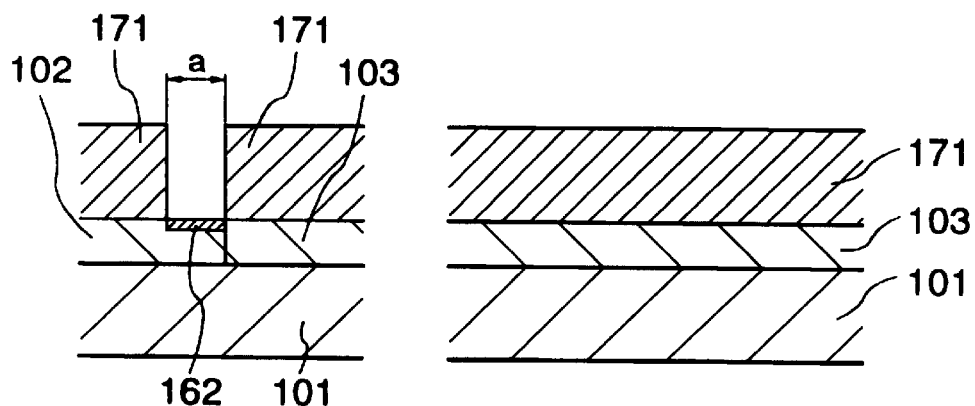

Then, as shown in FIG. 7B, the region in the P well 102, other than its region a close to the end portion of the N well 103, is masked by a photoresist 171 and boron is ion-implanted into the region a at an implantation energy of 20 KeV and dose of $5\times 10^{12} cm^{-2}$, and thermal process is applied. As a result, the P-type impurity diffusion layer 162 having a higher impurity concentration than that of the other region of the P well 102 is formed in the region a. The thermal precess for forming the impurity diffusion layer 162 and the thermal process for forming the P well 102 and the N well 103 may be conducted simultaneously. Then, the photoresist 171 is removed.

Figure 7C:
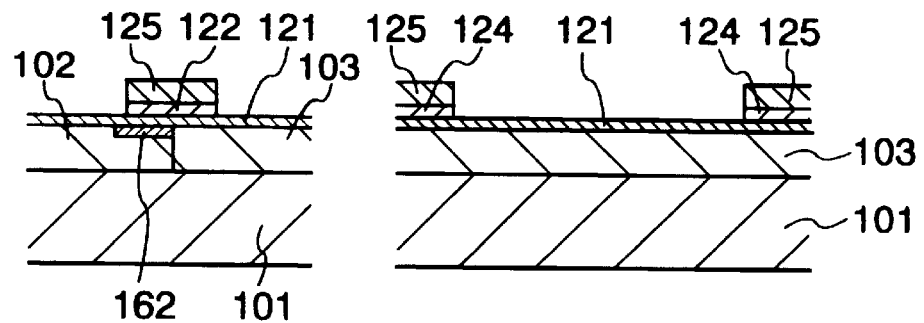

Next, as shown in FIG. 7C, the surface of the silicon substrate 101 in which the wells 102 and 103 are formed is thermally oxidized to form a shield gate insulation film 121 having a film thickness of approximately 50 nm. A polysilicon film having a film thickness of approximately 150 nm is formed on the shield gate insulation film 121. Phosphorus is thermally diffused into the polysilicon film to lower its resistance and a silicon oxide film 125 having a film thickness of approximately 250 nm is formed on the polysilicon film by the CVD method. Then, a photoresist mask (not shown) is applied and predetermined portions of the silicon oxide film 125 and the polysilicon film are etched away to form a predetermined pattern of the shield plate electrodes 122, 123 and 124 each having a cap insulation film 125.

Patterning is conducted such that a boundary area between the P well 102 and the N well 103 is positioned almost below a center of the shield plate electrode 122.

Figure 7D:
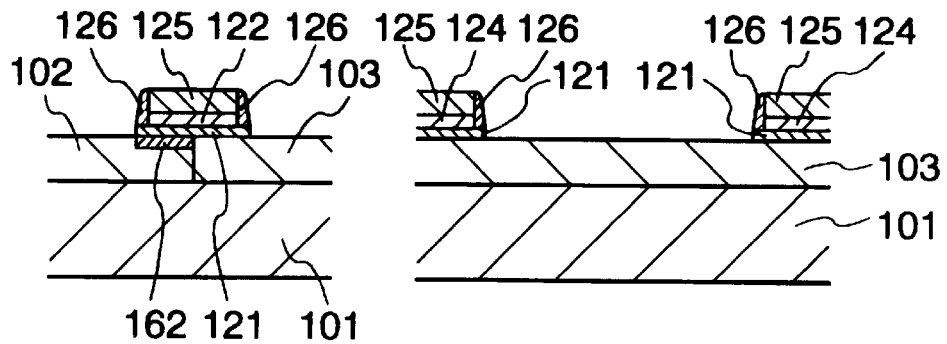

Then, as shown in FIG. 7D, a silicon oxide film having a film thickness of approximately 200 nm is formed on the entire surface by the CVD method and the silicon oxide film is etched back by the anisotropic dry etching to form sidewall insulation films 126 on the opposite sides of the shield plate electrodes 122, 123 and 124. The shield gate insulation film 121 on the element region is also etched away.

Figure 7E:
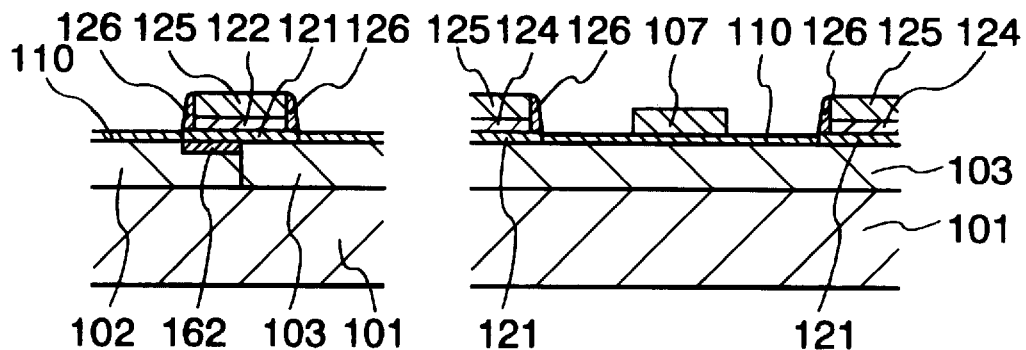

Then, as shown in FIG. 7E, the surface of the silicon substrate 101 in the exposed element region is thermally oxidized to form the gate insulation film 110 having a film thickness of approximately 15 nm. A polysilicon film having a film thickness of approximately 200 nm is formed on the gate insulation film 110 by the CVD method. Phosphorus is diffused in the polysilicon film to lower its resistance and a photoresist mask (not shown) is applied and predetermined portions of the polysilicon film are etched away to form a predetermined pattern of gate electrodes 104 and 107.

Figure 7F:
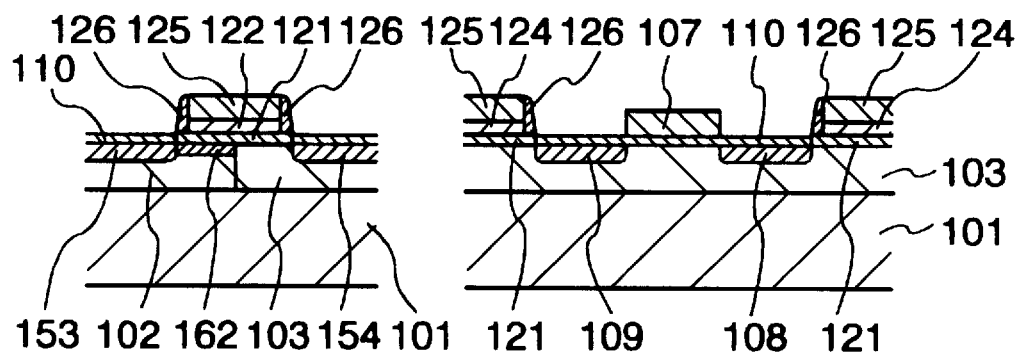

Then, as shown in FIG. 7F, the patterns of the gate electrodes 104 and 107 and the field shield element-isolation structure are used as masks in ion-implantation of arsenic in the P well 102 at an implantation energy of 60 KeV and dose of $5\times10^{15} cm^{-2}$ and ion-implantation of boron difluoride at an implantation energy of 40 KeV and dose of $5\times10^{15} cm^{-2}$, and they are thermally processed to form the impurity diffusion layers 105, 106, 108, 109, 153 and 154 in the respective regions. By those steps, the PMOS transistor 152 is formed on the right side and the NMOS transistor 151 is formed in a region not shown.

Figure 7G:
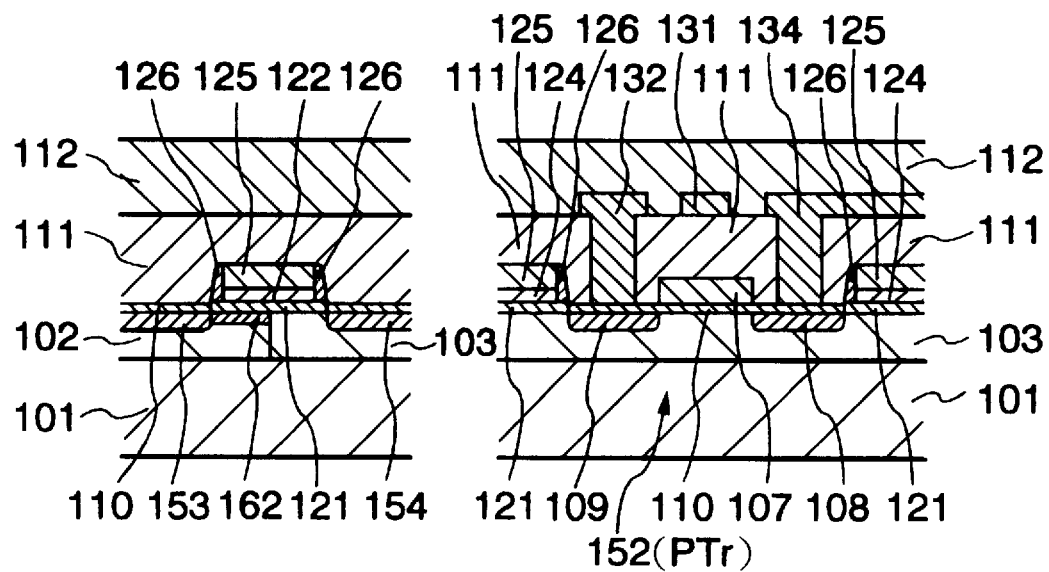

Then, as shown in FIG. 7G, a silicon oxide film which serves as the interlayer insulation film 111 is formed on the entire surface by the CVD method, a contact hole is formed at a predetermined portion of the interlayer insulation film 111, aluminum wrings 131–134 are patterned by the sputtering method and the fine work technology, and a silicon oxide film which serves as a second interlayer insulation film 112 is formed by the CVD method. By those steps, the CMOS circuit whose elements are isolated from each other by the field shield element-isolation structure as shown in FIGS. 5 and 6 is manufactured.

In the present embodiment, the shield plate 124 is connected to the power supply terminal $V_{cc}$ (not shown) through the aluminum wiring 134 and the P-type impurity diffusion layer 154, and the shield plate electrode 123 is connected to a ground terminal $V_{ss}$ (not shown) through the aluminum wiring 133 and the N-type impurity diffusion layer 153. Namely, the potential of the shield plate electrode 124 is fixed to the power supply potential ($V_{cc}$) and the potential of the shield plate electrode 123 is fixed to the ground potential ($V_{ss}=0$ (V)). Thus, an inversion layer is not formed in either an area in the N well 103 below the shield plate electrode 124 or an area in the P well 102 below the shield plate electrode 123.

Further, the shield plate electrode 122 is connected to the power supply terminal $V_{cc}$ (not shown) through the aluminum wiring 134 and the P-type impurity diffusion layer 154 so that the potential thereof is fixed to the power supply potential ($V_{cc}$).

It is assumed that the potential of the shield plate electrode 122, measured with respect to the source potential ($V_{ss}$) of the NMOS transistor 151 when the inversion layer is formed in the region a shown in FIG. 6A, is $V_{tN}$, and the potential of the shield plate electrode 122, as measured with respect to the source potential ($V_{cc}$) of the PMOS transistor 152 when the inversion layer is formed in the region b shown in FIG. 6A, is $V_{tP}$. In the CMOS device of the present embodiment, $V_{tN}$ and $V_{tP}$ are controlled by the impurity concentrations of the impurity diffusion layer 162 and the N well 103 to meet $V_{tN}>V_{cc}-V_{ss}$ and $V_{tP}<0$. When a potential $V_{sP}$ which meets $V_{tN}>V_{sP}-V_{ss}>V_{tP}+V_{cc}-V_{ss}$ is applied to the shield plate electrode 122 of the field shield element-isolation structure, no parasitic MOS transistor in any region conducts.

Specifically, when the power supply voltage is $V_{cc}=3.3$ (V), $V_{tN}$ and $V_{tP}$ are controlled to meet $V_{tN}>3.3$ (V) and $V_{tP}<0$ (V), and $V_{cc}=3.3$ (V) is applied to the shield plate electrode 122 as $V_{sP}$, the potential of the shield plate electrode 122 measured with respect to the source potential ($V_{ss}$) of the NMOS transistor 151 is 3.3–0=3.3 (V), which is smaller than $V_{tN}$, so that no inversion layer is formed in the region a below the shield plate electrode 122. On the other hand, when $V_{cc}=3.3$ (V) is applied to the shield plate electrode 122 as $V_{sP}$, the potential of the shield plate electrode 122 measured with respect to the source potential ($V_{cc}$) of the PMOS transistor 152 is 3.3–3.3=0 (V), which is larger than $V_{tP}$ so that no inversion layer is formed in the region b below the shield plate electrode 122.

In the present embodiment, the ions are implanted to the region a below the shield plate electrode 122 to form the impurity diffusion layer 162 so that the values of $V_{tN}$ and $V_{tP}$ are determined to meet $V_{tN}-V_{tP}>V_{cc}-V_{ss}$ and the potential $V_{sP}$ which meets $V_{tN}>V_{tP}-V_{ss}>V_{tP}+V_{cc}-V_{ss}$, is applied to the shield plate electrode 122 so that the inversion layers are not formed in the regions a and b below the shield plate electrode 122. Accordingly, a sufficient isolation capability is provided only by the regions a and b below the shield plate electrode 122 without increasing the width from the left end of the source/drain 108 and 109 of the PMOS transistor 152 to the left end of the impurity diffusion layer 154 so that the separation width may be smaller than that required in the prior art and a higher integration density is attained.

Further, since the $V_{tN}$ is controlled by the surface impurity concentration of the impurity diffusion layer 162 formed in the P well 102 below the shield plate electrode 122, it is not necessary to increase the impurity concentration of other portion of the P well 102. Accordingly, the threshold voltage of the NMOS transistor is not unduly high and the NMOS transistor 151 may be operated at a high speed and a junction breakdown of the source/drains 105 and 106 and the P well 102 may be increased.

In the present embodiment, when $V_{tN}$ and $V_{tP}$ are controlled to meet $V_{tN}>0$ (V) and $V_{tP}<-V_{cc}$, $V_{sP}=0$ (V) can be met. Further, $V_{tN}$ and $V_{tP}$ may be controlled to meet $V_{tN}\leq 0$ or $V_{tP}\geq 0$ so that the parasitic transistors are normally on.

Referring to FIGS. 8A–8D, another method for manufacturing the CMOS structure shown in FIGS. 5 and 6 is explained. In FIGS. 8A–8D, a sectional view of a boundary portion between the P well 102 and the N well 103 is shown on the left side and a sectional view corresponding to a portion of the P-channel MOS transistor PTr of FIG. 6C is shown on the right side.

In the present embodiment, the ion implantation to form the impurity diffusion layer 162 in the region a is also used to control the threshold voltage of the PMOS transistor 152. Namely, the ion-implantation is applied to the region a and also to the N well 103.

Figure 8A:
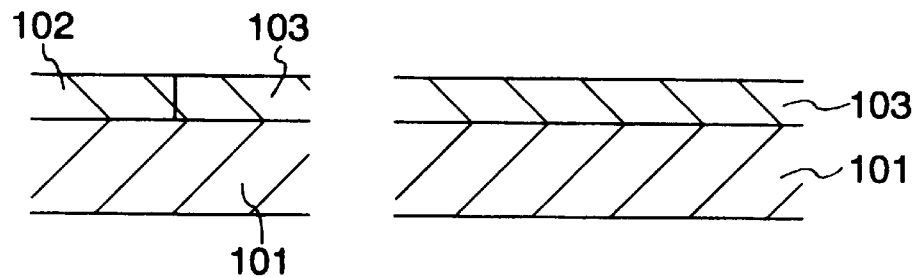
FIGS. 8A–8D show sectional views in the respective steps of another method for manufacturing the CMOS semiconductor device of the second embodiment of the present invention.

First, as shown in FIG. 8A, the region of the P-type silicon substrate 101 in which the N well 103 is to be formed is masked by a photoresist and boron is ion-implanted to the region in which the P well 102 is to be formed at an implantation energy of 60 KeV and dose of $1 \times 10^{13} \text{cm}^{-2}$, and the photoresist is removed. Then, the region in which the P well 102 is to be formed is masked by a photoresist and phosphorus is ion-implanted to the region in which the N well 103 is to be formed at an implantation energy of 150 KeV and dose of $1 \times 10^{13} \text{cm}^{-2}$. After the photoresist is removed, it is thermally processed at a temperature of 1100° C. for 6 hours to diffuse and activate the impurities to form the P well 102 and the N well 103.

Figure 8B:
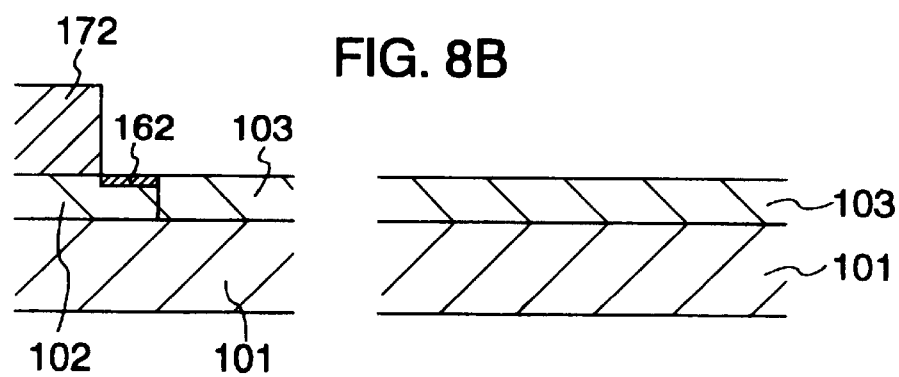

Then, as shown in FIG. 8B, an area other than the region a of the P well 102 in the vicinity of its end closer to the N well 103 and the N well 103 is masked by the photoresist 172, boron is ion-implanted to the region a and the N well 103 at an implantation energy of 20 KeV and dose of $4 \times 10^{12} \text{cm}^{-2}$, and it is thermally processed. Thus, the P-type impurity diffusion layer 162 having a higher impurity concentration than that of the P well 102 is formed in the region a, an effective surface impurity density of the N well 103 is reduced and the threshold voltage of the P-channel MOS transistor approaches to 0 (V). The thermal process to form the impurity diffusion layer 162 and the thermal process to form the P well 102 and the N well 103 may be conducted simultaneously. Then, the photoresist 172 is removed.

Figure 8C:
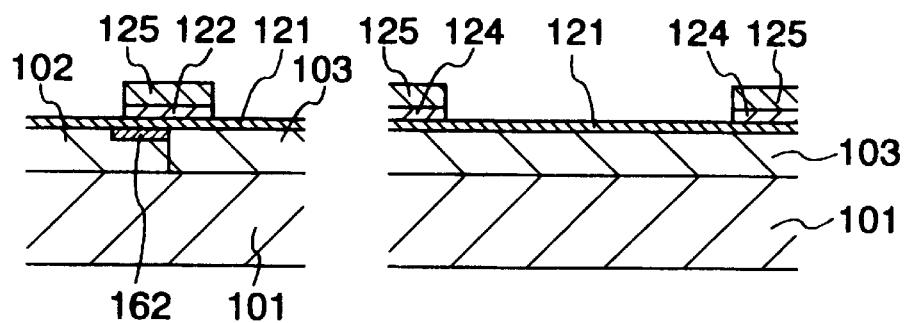

Then, as shown in FIG. 8C, the surface of the silicon substrate 101 in which the wells 102 and 103 are formed is thermally oxidized to form the shield gate insulation film having a film thickness of approximately 50 nm. Then, a polysilicon film having a film thickness of approximately 150 nm is formed on the shield gate insulation film 121 by the CVD method. Then, phosphorus is thermally diffused in the polysilicon film to lower its resistance and a silicon oxide film 125 having a film thickness of approximately 250 nm is formed on the polysilicon film by the CVD method. Next, by using a photoresist mask (not shown), predetermined portions of the silicon oxide film 125 and the polysilicon film are etched away to form a predetermined pattern of the cap insulation film 125 and each of the shield plate electrodes 122, 123 and 124. The patterning is conducted such that a boundary area between the P well 102 and the N well 103 is positioned almost below a center of the shield plate electrode 122.

Figure 8D:
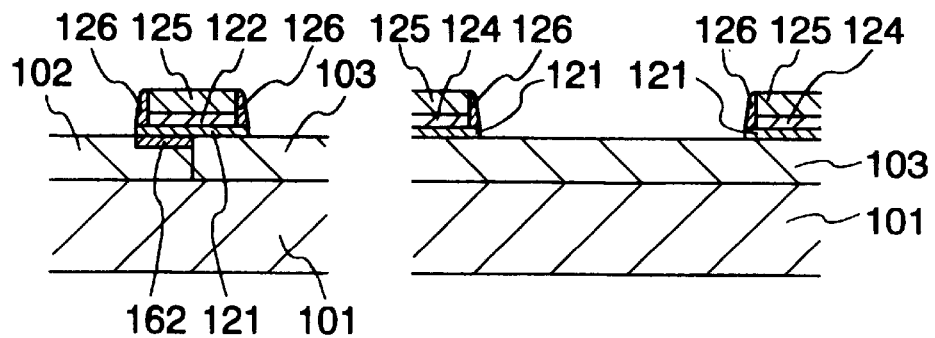

Then, as shown in FIG. 8D, a silicon oxide film having a film thickness of approximately 200 nm is formed on the entire surface by the CVD method and the silicon oxide film is etched back by the anisotropic dry etching to form the sidewall insulation films 126 on the opposite sides of each of the shield plate electrodes 122, 123 and 124. The shield gate insulation film 121 in the element region is also etched away.

By conducting the steps similar to those of FIGS. 7E–7G, the CMOS circuit, whose elements are isolated from each other by the field shield element-insolation structure as shown in FIGS. 5 and 6, is manufactured.

In the present embodiment, the threshold voltage of the PMOS transistor 152 is controlled simultaneously with the ion implantation process for forming the impurity diffusion layer 162. Accordingly, the impurity diffusion layer 162 may be formed with the same number of steps as that of the prior art.

Referring to FIGS. 5, 9 and 10A–10G, a third embodiment of the present invention is explained. In the present embodiment, the same elements as those in the second embodiment are designated by the same numerals.

A plan view of the CMOS inverter circuit of the present embodiment is shown in FIG. 5 like the second embodiment.

Figure 9:
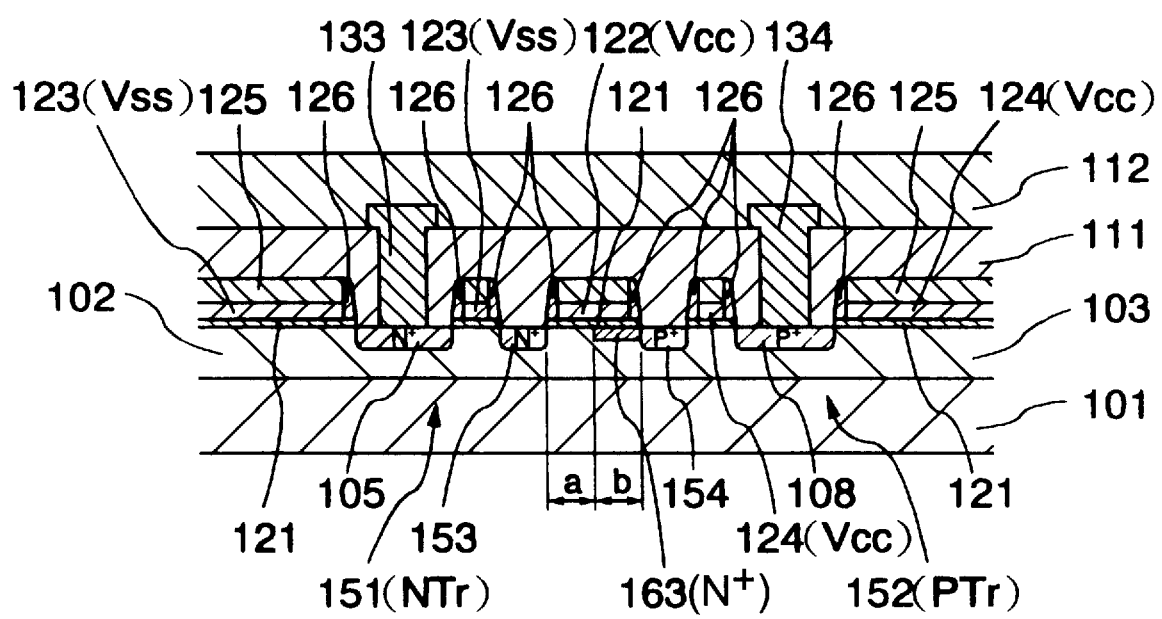
FIG. 9 shows a plan view of a CMOS semiconductor device in accordance with a third embodiment of the present invention.

FIG. 9 shows a sectional view corresponding to FIG. 6A. Sectional views taken along VIB—VIB and VIC—VIC in FIG. 5 are similar to those of FIGS. 6B and 6C.

The present embodiment is different in structure from the second embodiment with respect to a portion below the shield plate electrode 122 formed on the boundary area between the P well 102 and the N well 103. That is, an impurity diffusion layer 163 including an N-type impurity such as arsenic at a high concentration is formed in the region (region b in FIG. 9) below the shield plate electrode 122 in the surface of the N well 103. Such an impurity diffusion layer is not formed in the region (region a in FIG. 9) below the shield plate electrode 122 in the surface of the P well 102 and the impurity concentration of the region a is equal to that of the other region in the P well 102.

Referring to FIGS. 10A–10G, a method for manufacturing the CMOS structure described above is explained. In each of FIGS. 10A–10G, a sectional view of the boundary area between the P well 102 and the N well 103 corresponding to FIG. 9 is shown on the left-half and a sectional view corresponding to the portion of the P-channel MOS transistor PTr of FIG. 6B is shown on the right-half.

Figure 10A:
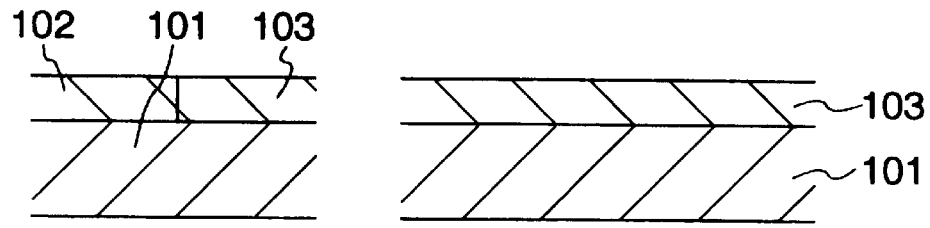
FIGS. 10A–10G show sectional views in the respective steps of a method for manufacturing the CMOS semiconductor device of the third embodiment of the present invention.

First, as shown in FIG. 10A, a region of the P silicon substrate in which the N well 103 is to be formed is masked by a photoresist, boron is ion-implanted to the region in which the P well 102 is to be formed at an implantation energy of 60 KeV and dose of $1 \times 10^{13} \text{cm}^{-2}$, and the photoresist is removed. Then, the region in which the P well 102 is to be formed is masked by a photoresist and phosphorus is ion-implanted to the region in which the N well is to be formed at an implantation energy of 150 KeV and dose of $1 \times 10^{13} \text{cm}^{-2}$. Then, after the photoresist is removed, it is thermally processed at a temperature of 1100° C. for 6 hours to diffuse and activate the impurities to form the P well 102 and the N well 103, respectively.

Figure 10B:
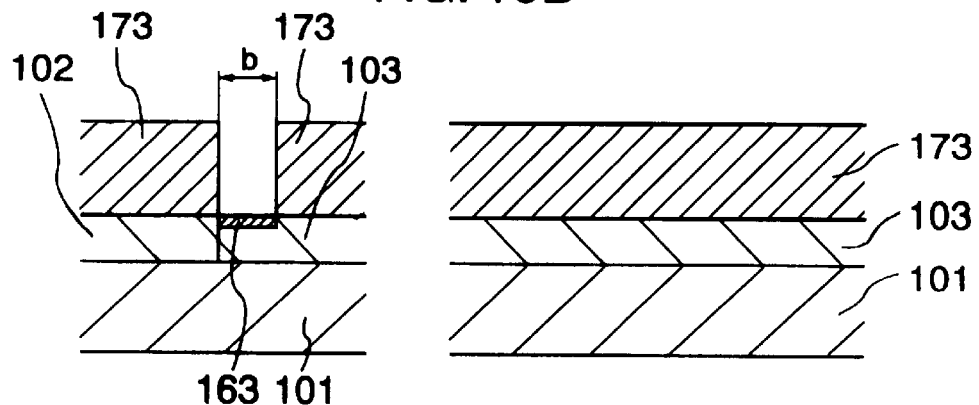

Then, as shown in FIG. 10B, the portion of the N well 103 other than the region b in the vicinity of its end closer to the P well 102 is masked by a photoresist 173, phosphorus is ion-implanted to the region b at an implantation energy of 60 KeV and dose of $5 \times 10^{12} \text{cm}^{-2}$ and it is thermally processed. Thus, the impurity diffusion layer 163 which has a higher impurity concentration than that of the N well 103 is formed in the region b. At this time, phosphorus may be ion-implanted to the P well 102 as well in order to control the threshold voltage of the NMOS transistor 151 in parallel. Then, the photoresist 173 is removed.

Figure 10C:
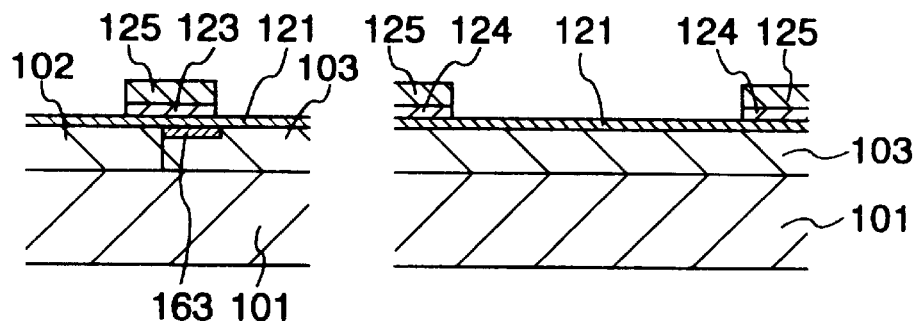

Next, as shown in FIG. 10C, the surface of the silicon substrate 101 in which the wells 102 and 103 are formed is thermally oxidized to form the shield gate insulation film 121 having a film thickness of approximately 50 nm. A polysilicon film having a film thickness of approximately 150 nm is formed on the shield gate insulation film 121. Phosphorus is thermally diffused in the polysilicon film to lower its resistance and the silicon oxide film 125 having a film thickness of approximately 250 nm is formed on the polysilicon film by the CVD method. Then, by using a photoresist mask (not shown), predetermined portions of the silicon oxide film 125 are etched away to form a predetermined pattern of the cap insulation film 125 and each of the shield plate electrodes 122, 123 and 124. At this time, the patterning is conducted such that the boundary area between the P well 102 and the N well 103 is positioned almost below the center of the shield plate electrode 122.

Figure 10D:
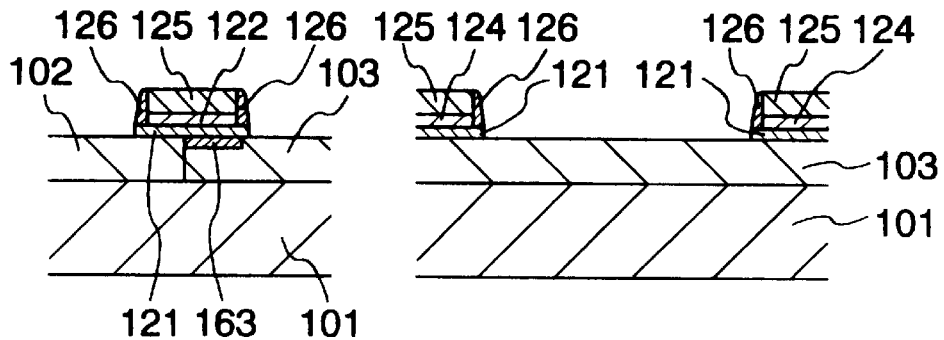

Then, as shown in FIG. 10D, a silicon oxide film having a film thickness of approximately 200 nm is formed on the entire surface by the CVD method and the silicon oxide film is etched back by the anisotropic dry etching to form the sidewall insulation films 126 on the opposite sides of each of the shield plate electrodes 122, 123 and 124. At this time, the shield gate insulation film 121 is also etched away, as shown.

Figure 10E:
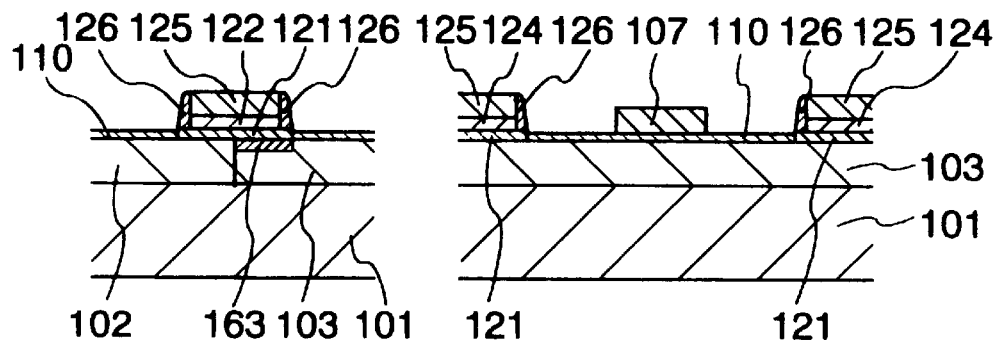

Then, as shown in FIG. 10E, the surface of the silicon substrate in the exposed element region is thermally oxidized to form the gate insulation film 110 having a film thickness of approximately 15 nm. Then, a polysilicon film having a film thickness of approximately 200 nm is formed on the gate insulation film 110 by the CVD method. Phosphorus is thermally diffused in the silicon film to lower its resistance, and by using a photoresist mask (not shown), predetermined portions of the polysilicon film are etched away to form a predetermined pattern of the gate electrodes 104 and 107.

Figure 10F:
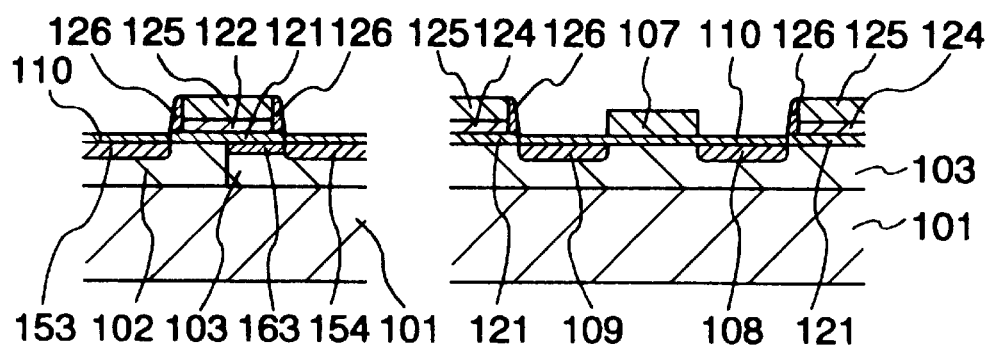

Then, as shown in FIG. 10F, by using the pattern of the gate electrodes 104 and 107 and the field shield element-isolation structure as a mask, arsenic is ion-implanted to the P well 102 at an implantation energy of 60 KeV and dose of $5\times10^{15} cm^{-2}$ and boron difluoride is ion-implanted to the N well 103 at an implantation energy of 40 KeV and dose of $5\times10^{15} cm^{-2}$, and they are thermally processed to form the impurity diffusion layers 105, 106, 108, 109, 153 and 154 in the respective regions. By those steps, the PMOS transistor 152 is formed on the right side and the NMOS transistor 151 is formed in a region not shown.

Figure 10G:
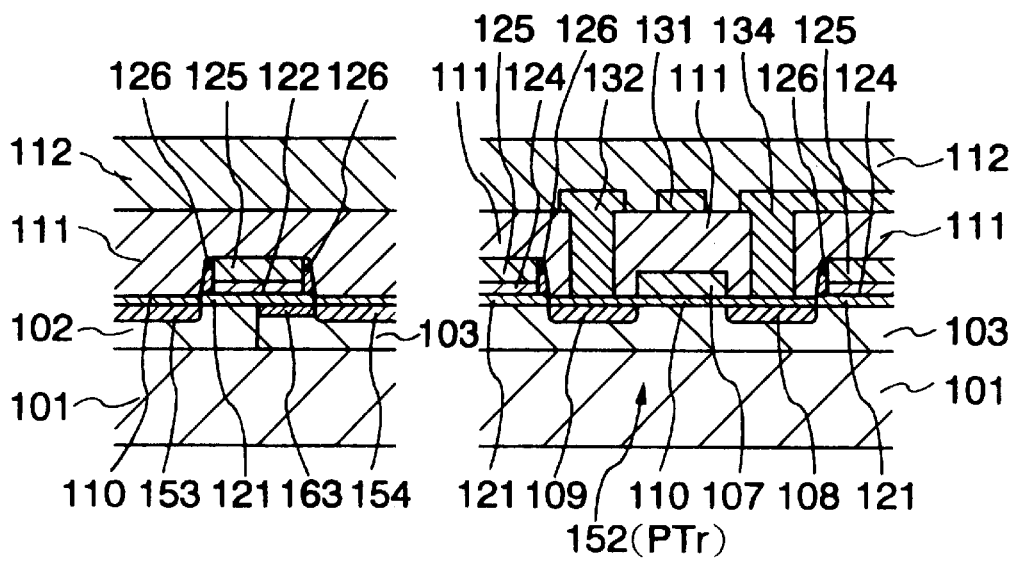

Next, as shown in FIG. 10G, a silicon oxide film which serves as the interlayer insulation film 111 is formed on the entire surface by the CVD method, a contact hole is formed at a predetermined portion of the interlayer insulation film 111, the aluminum wirings 131–134 are patterned by the sputtering method and the fine work technology and a silicon oxide film which serves as the second interlayer insulation film 112 is formed by the CVD method. By those steps, the CMOS circuit, whose elements are isolated from each other by the field shield element-isolation structure as shown in FIGS. 5 and 9, is manufactured.

The potentials of the shield plate electrodes 122, 123 and 124 in the present embodiment are now explained.

In the present embodiment, the shield plate electrode 124 is connected to the power supply terminal (not shown) through the aluminum wiring 134 and the P-type impurity diffusion layer 154, and the shield plate electrode 123 is connected to the ground terminal (not shown) through the aluminum wiring 133 and the N-type impurity diffusion layer 153. Namely, the potential of the shield plate electrode 124 is fixed to the power supply potential ($V_{cc}$) and the potential of the shield plate electrode 123 is fixed to the ground potential ($V_{ss}$=0 (V)). Thus, no inversion layer is formed in either an area of the N well 103 below the shield plate electrode 124 or an area of the P well 102 below the shield plate electrode 123.

The shield plate electrode 122 is connected to the power supply terminal (not shown) through the aluminum wiring 134 and the P-type impurity diffusion layer 154 and the potential thereof is fixed to the power supply voltage ($V_{cc}$).

It is assumed that the potential of the shield plate electrode 122, measured with respect to the source potential ($V_{ss}$) of the NMOS transistor when the inversion layer is formed in the region a shown in FIG. 9, is $V_{tN}$, and the potential of the shield plate electrode 122 measured with respect to the source potential ($V_{cc}$) of the PMOS transistor 152 when the inversion layer is formed in the region b shown in FIG. 9 is $V_{tP}$. In the CMOS device of the present embodiment, $V_{tN}$ and $V_{tP}$ are controlled by the impurity concentrations of the impurity diffusion layer 163 and the P well 102 to meet $V_{tP}<V_{ss}-V_{cc}$ and $V_{tN}>0$. When a potential $V_{sP}$ which meets $V_{tN}>V_{sP}-V_{ss}>V_{tP}+V_{cc}-V_{ss}$ is applied to the shield plate electrode 122 of the field shield element-isolation structure, no parasitic MOS transistor in any region conducts.

Specifically, when the power supply voltage $V_{cc}$=3.3 (V), $V_{tN}$ and $V_{tP}$ are controlled to meet $V_{tN}>0$ (V) and $V_{tP}<-3.3$ (V), and $V_{ss}$=0 (V) is applied to the shield plate electrode as $V_{sP}$. The potential of the shield plate electrode 122 measured with respect to the source potential ($V_{ss}$) of the NMOS transistor 151 is 0−0=0 (V), which is smaller than $V_{tN}$, so that no inversion layer is formed in the region a below the shield plate electrode 122. On the other hand, when $V_{cc}$=0 (V) is applied to the shield plate electrode 122 as $V_{sP}$, the potential of the shield plate electrode 122 as viewed from the source potential ($V_{cc}$) of the PMOS transistor 152 is 0−3.3=−3.3 (V), which is larger than $V_{tP}$, so that no inversion layer is formed in the region b below the shield plate electrode 122.

In this manner, in the present embodiment, the ion implantation is conducted to the region b of the shield plate electrode 122 to form the impurity diffusion layer 163 so that $V_{tN}$ and $V_{tP}$ are set to meet $V_{tN}-V_{tP}>V_{cc}-V_{ss}$, and the potential $V_{sP}$ which meets $V_{tN}>V_{sP}-V_{ss}>V_{tP}+V_{cc}-V_{ss}$ is applied to the shield plate electrode 122 so that no inversion layer is formed in the regions a and b below the shield plate electrode 122. Thus, a sufficient separation is attained only by the regions a and b below the shield plate electrode 122 without increasing the width from the right end of each of the source/drains 105 and 106 of the NMOS transistor 151 to the right end of the impurity diffusion layer 153 or the width from the left end of each of the source/drains 108 and 109 of the PMOS transistor 152 to the left end of the impurity diffusion layer 154, and the separation width may be narrower than that of the prior art and a higher integration density can be attained.

Referring to FIGS. 5, 11 and 12A–12H, a fourth embodiment of the present invention is explained. In the present embodiment, the elements which are the same as those in the second embodiment are designated by like numerals.

Figure 11:
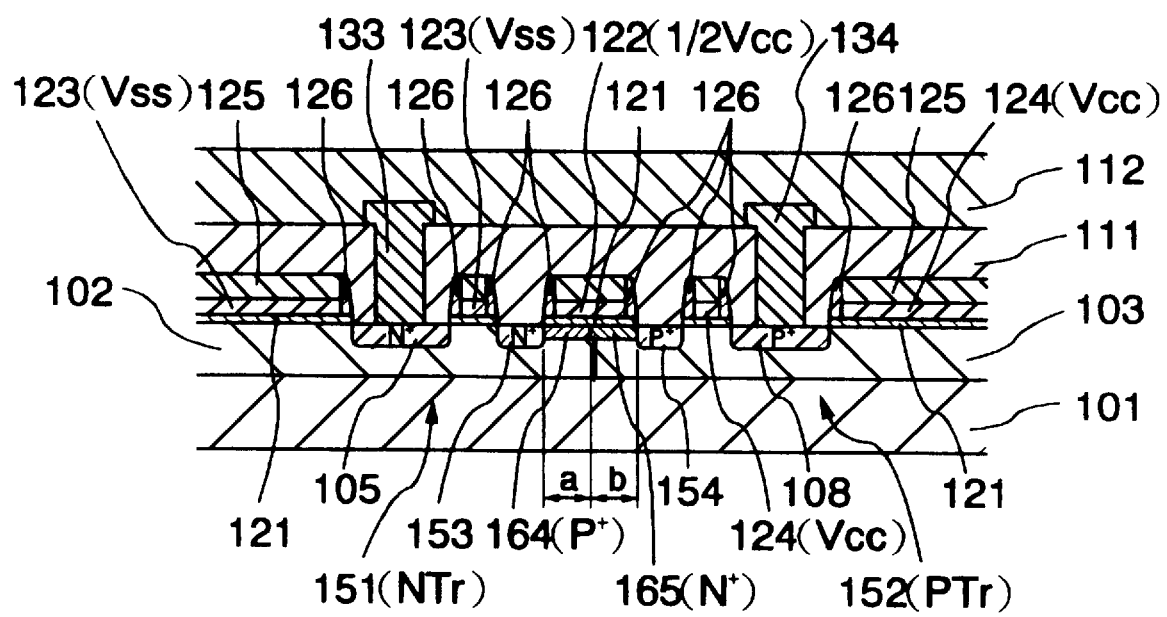
FIG. 11 shows a plan view of a CMOS semiconductor device in accordance with a fourth embodiment of the present invention.

A plan view of the CMOS inverter circuit of the present embodiment is shown in FIG. 5 like the plan view of the second embodiment. FIG. 11 shows a sectional view corresponding to FIG. 6A. Sectional views taken along VIB—VIB and VIC—VIC of FIG. 5 are similar to those of FIGS. 6B and 6C.

The present embodiment is different in structure from the second or third embodiment with respect to a portion below the shield plate electrode 122 formed on the boundary area between the P well 102 and the N well 103. That is, a P-type impurity diffusion layer 164 containing a high concentration of P-type impurity such as boron is formed at the region (region a in FIG. 11) below the shield plate electrode 122 in the surface area of the P well 102, and the N-type impurity diffusion layer 165 containing high concentration of N-type impurity such as arsenic is formed at the region (region b in FIG. 11) below the shield plate electrode 122 in the surface area of the N well 103.

Referring to FIGS. 12A–12H, a method for manufacturing the CMOS structure described above is explained. In each of FIGS. 12A–12H, a sectional view of the boundary area between the P well 102 and the N well 103 corresponding to FIG. 11 is shown on the left-half and a sectional view corresponding to the portion of the P-channel MOS transistor PTr of FIG. 6C is shown on the right-half.

Figure 12A:
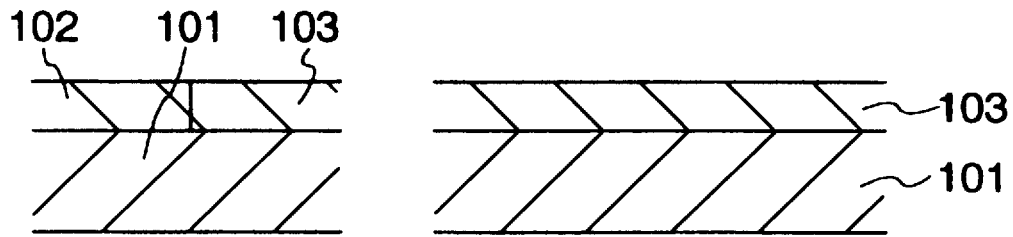
FIGS. 12A–12H show sectional views in the respective steps of a method for manufacturing the CMOS semiconductor device of the fourth embodiment of the present invention.

First, as shown in FIG. 12A, a region of a P-type silicon substrate 101 in which an N well 103 is to be formed is masked by a photoresist, boron is ion-implanted to a region in which a P well 102 is to be formed at an implantation energy of 60 KeV and dose of $1 \times 10^{13} \text{cm}^{-2}$, and the photoresist is removed. Then, the region in which the P well 102 is formed is masked by a photoresist and phosphorus is ion-implanted to the region in which the N well 103 is to be formed at an implantation energy of 150 KeV and dose of $1 \times 10^{13} \text{cm}^{-2}$. After the photoresist is removed, it is thermally processed at a temperature of 1100° C. for 6 hours to diffuse and activate the impurities to form the P well 102 and the N well 103.

Figure 12B:
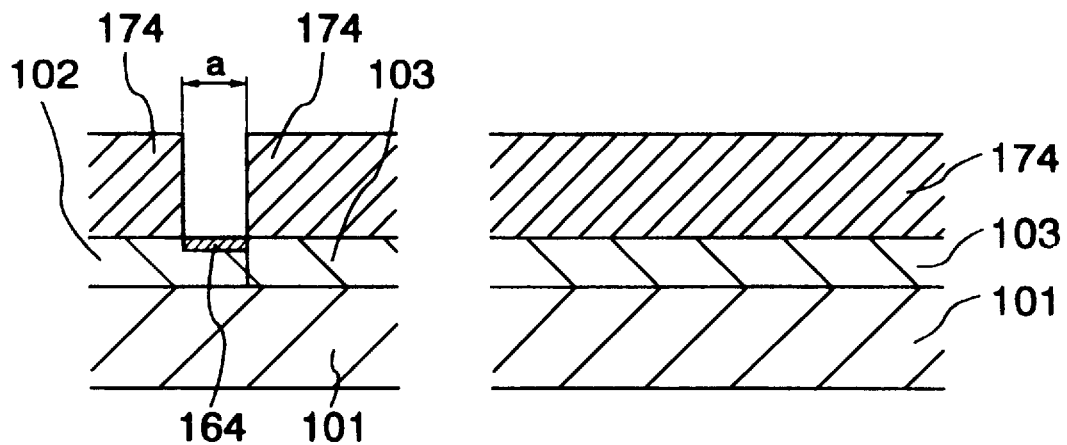

Then, as shown in FIG. 12B, the whole surface area other than the region a of the P well in the vicinity of its end closer to the N well is masked by a photoresist 174 and boron is ion-implanted to the region a at an implantation energy of 20 KeV and dose of $5 \times 10^{12} \text{cm}^{-2}$, and it is thermally processed. Thus, the P-type impurity diffusion layer 164 having a higher impurity concentration than the P well 102 is formed in the region a. At this time, ions may be implanted to the N well 103 to simultaneously control the threshold voltage of the PMOS transistor 152.

Figure 12C:
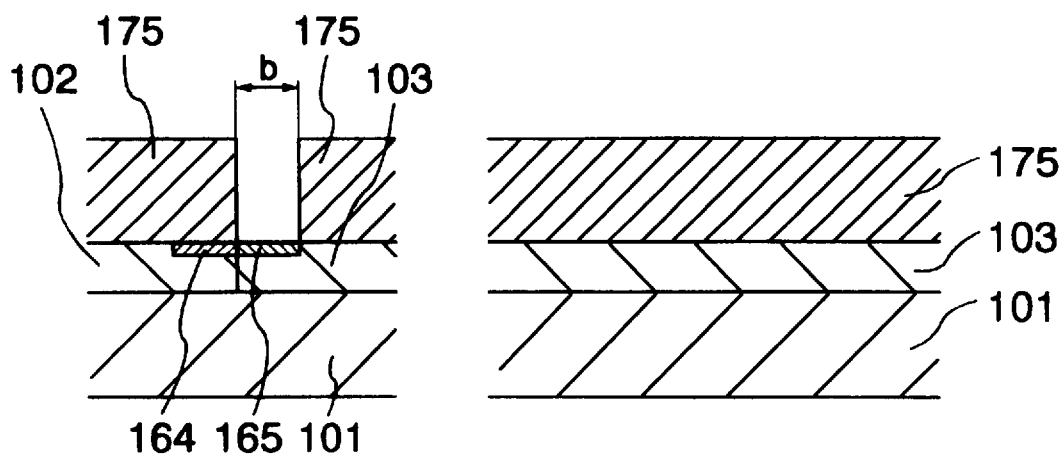

Then, as shown in FIG. 12C, the whole surface area other than the region b of the N well 103 in the vicinity of its end closer to the P well 102 is masked by the photoresist 175 and phosphorus is ion-implanted to the region b at an implantation energy of 60 KeV and dose of $3 \times 10^{12} \text{cm}^{-2}$, and it is thermally processed. Thus, the N-type impurity diffusion layer 165 having a higher impurity concentration than the N well 103 is formed in the region b. At this time, ions may be implanted to the P well 102 to simultaneously control the threshold voltage of the NMOS transistor 151. Then, the photoresist 173 is removed.

Figure 12D:
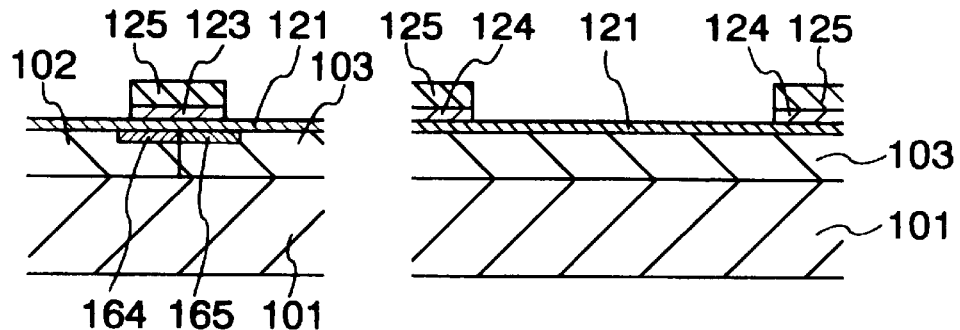

Next, as shown in FIG. 12D, the surface of the silicon substrate 101 having the wells 102 and 103 formed therein is thermally oxidized to form a shield gate insulation film 121 having a film thickness of approximately 50 nm. Then, a polysilicon film having a film thickness of 150 nm is formed on the shield gate insulation film 121 by the CVD method. Phosphorus is thermally diffused in the polysilicon film to lower its resistance and a silicon oxide film 125 having a film thickness of approximately 250 nm is formed on the polysilicon film by the CVD method. Then, by using a photoresist mask (not shown), predetermined portions of the silicon oxide film 125 and the polysilicon film are etched away to form a predetermined pattern of a cap insulation film 125 and each of the shield plate electrodes 122, 123 and 124. The patterning is conducted such that the boundary area between the P well 102 and the N well 103 is positioned almost below the center of the shield plate electrode 122.

Figure 12E:
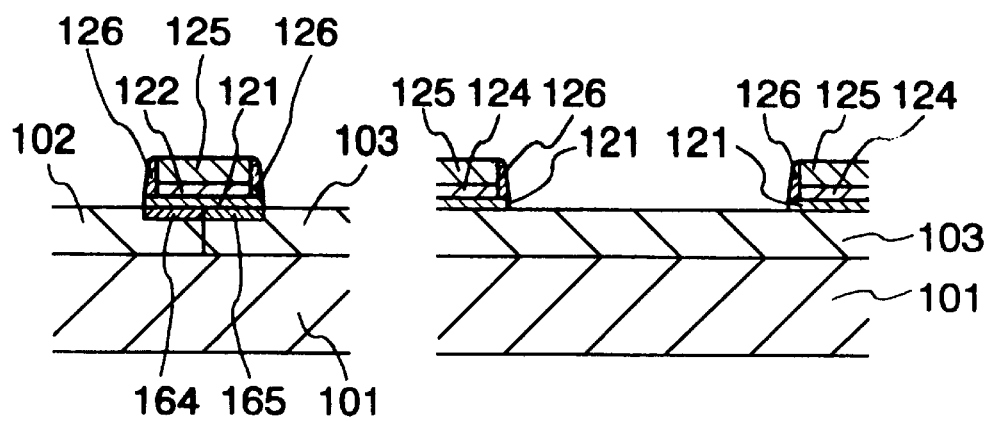

Then, as shown in FIG. 12E, a silicon oxide film having a film thickness of approximately 200 nm is formed on the entire surface by the CVD method and the silicon oxide film is etched back by anisotropic dry etching to form sidewall insulation films 126 on the opposite sides of each of the shield plate electrodes 122, 123 and 124. At this time, the shield gate insulation film 121 in the element region is also etched away, as shown.

Figure 12F:
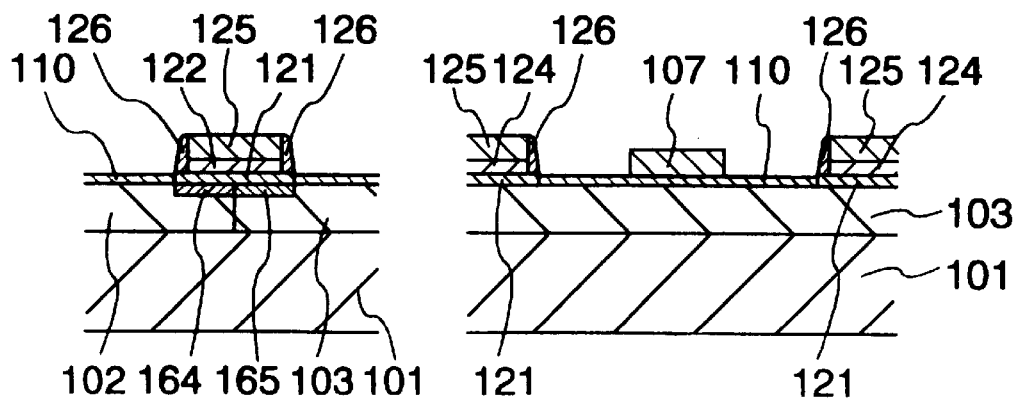

Then, as shown in FIG. 12F, the surface of the silicon substrate 101 in the exposed element region is thermally oxidized to form a gate insulation film 110 having a film thickness of approximately 15 nm. Then, a polysilicon film having a film thickness of approximately 200 nm is formed on the gate insulation film 110 by the CVD method. Phosphorus is thermally diffused in the polysilicon film to lower its resistance. Then, by using a photoresist mask (not shown), the predetermined portions of the polysilicon film are etched away to form a predetermined pattern of the gate electrodes 104 and 107.

Figure 12G:
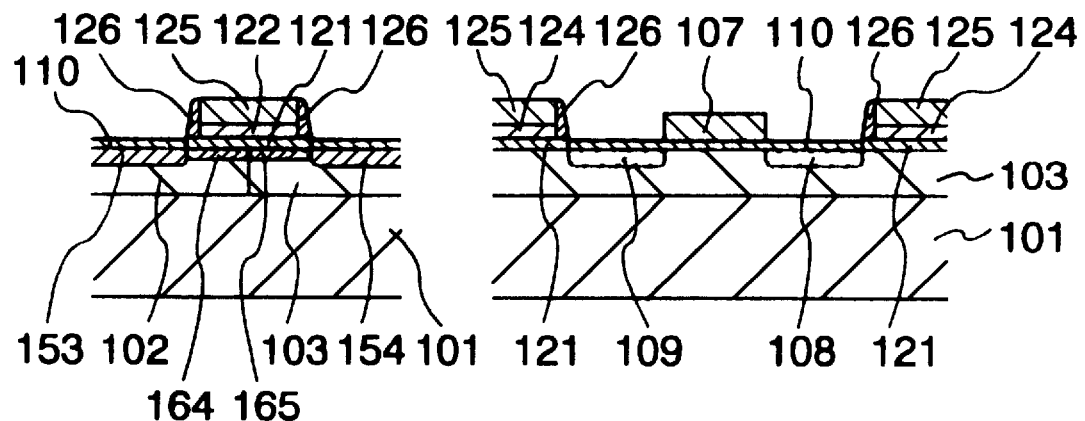

Then, as shown in FIG. 12G, by using the pattern of the gate electrodes 104 and 107 and the field shield element-isolation structure as a mask, arsenic is ion-implanted to the P well 102 at an implantation energy of 60 KeV and dose of $5 \times 10^{15} \text{cm}^{-2}$, boron difluoride is ion-implanted to the N well 103 at an implantation energy of 40 KeV and dose of $5 \times 10^{15} \text{cm}^{-2}$, and they are thermally processed to form the impurity diffusion layers 105, 106, 108, 109, 153 and 154 in the respective regions. By those steps, the PMOS transistor 152 is formed on the right side and the NMOS transistor 151 is formed in a selected portion not shown.

Figure 12H:
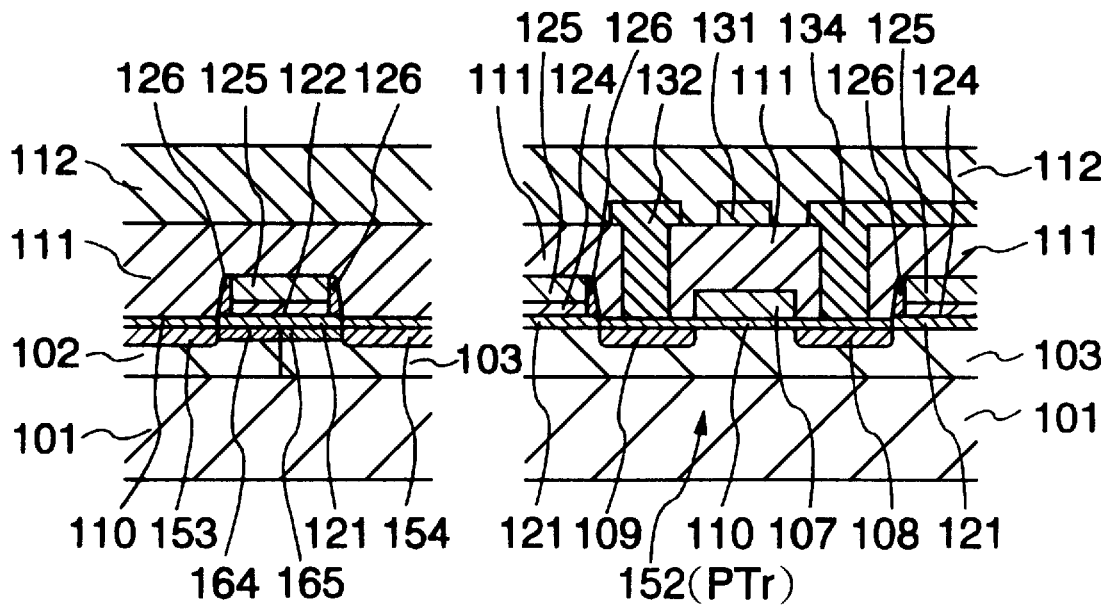
Figure 13:
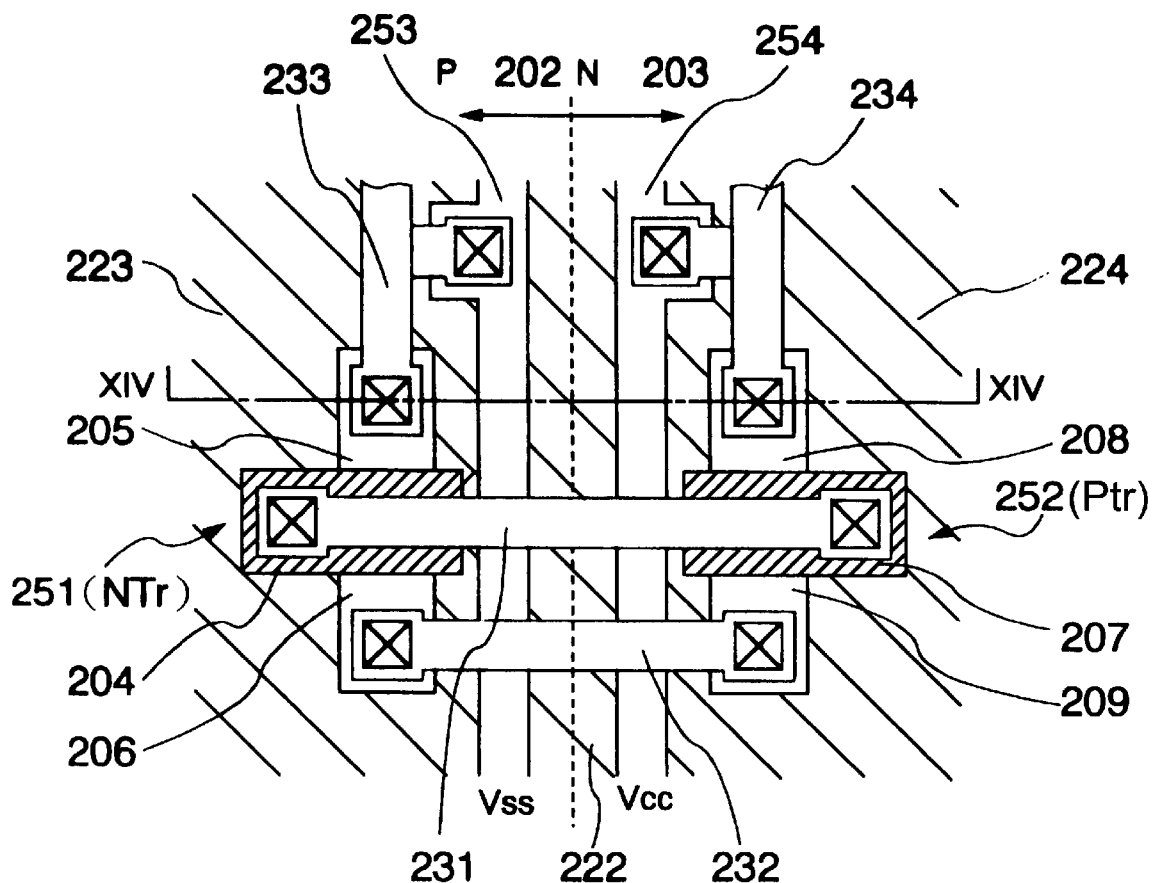
FIG. 13 shows a plan view of a prior art CMOS semiconductor device.
Figure 14:
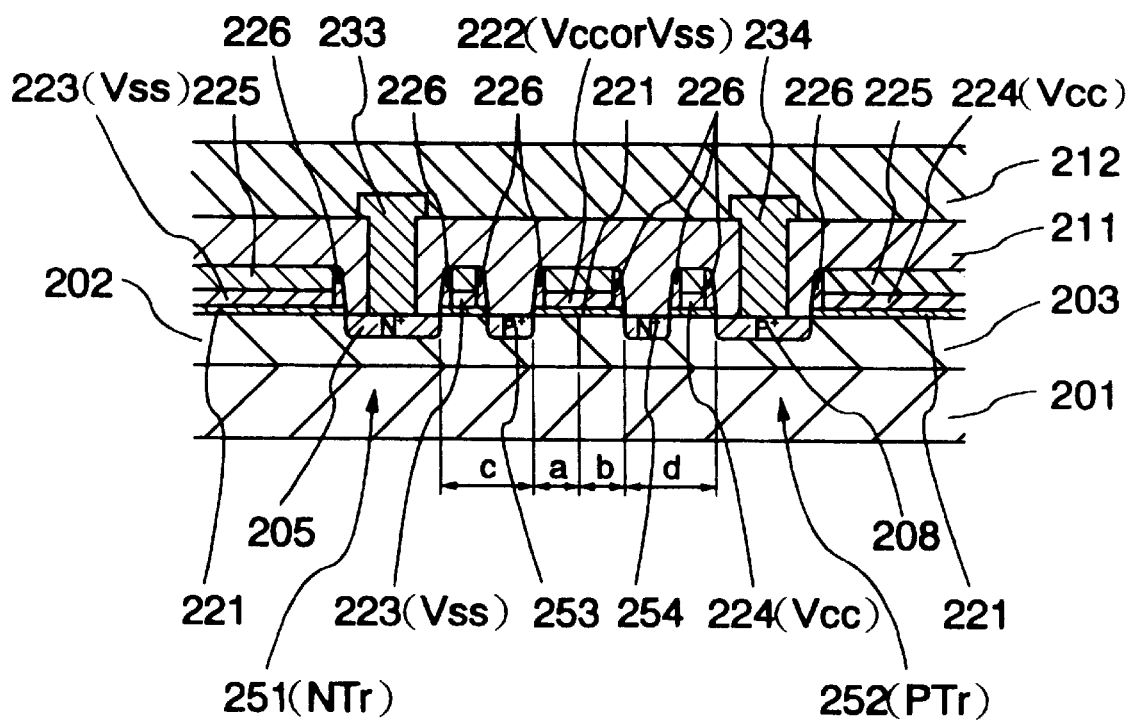
FIG. 14 shows a sectional view taken along XIV—XIV of FIG. 13.

Then, as shown in FIG. 12H, a silicon oxide layer which serves as the interlayer insulation film 111 is formed on the entire surface by the CVD method, a contact hole is formed in the predetermined area of the interlayer insulation film 111, aluminum wirings 131–134 are patterned thereon by the sputtering method and the fine work technology, and a silicon oxide film which serves as the second interlayer insulation film 112 is formed by the CVD method. By those steps, the CMOS circuit, whose elements are isolated from each other by the field shield element-isolation structure as shown in FIGS. 6 and 15 is manufactured.

The potentials of the shield plate electrodes 122, 123 and 124 in the present embodiment are explained.

In the present embodiment, the shield plate electrode 124 is connected to the power supply terminal (not shown) through the aluminum wiring 134 and the P-type impurity diffusion layer 154, and the shield plate electrode 123 is connected to the ground terminal (not shown) through the aluminum wiring 133 and the N-type impurity diffusion layer 153. Namely, the potential of the shield plate electrode 124 is fixed to the power supply potential ($V_{cc}$) and the potential of the shield plate electrode 123 is fixed to the ground potential ($V_{ss}=0$ (V)). Thus, no inversion layer is formed in either an area of the N well 103 below the shield plate electrode 123 or an area of the P well 102 below the shield plate electrode 123.

Further, the shield plate electrode 122 is connected to a ½ power supply terminal (not shown) through the aluminum wiring 134 and the P-type impurity diffusion layer 154 so that the potential thereof is fixed to the ½ power supply potential (½ $V_{cc}$).

It is assumed that the potential of the shield plate electrode 122 measured with respect to the source potential ($V_{ss}$) of the NMOS transistor 151 when the inversion layer is formed in the region a shown in FIG. 11 is $V_{tN}$, and the potential of the shield plate electrode 122 measured with respect to the source potential ($V_{cc}$) of the PMOS transistor 152 when the inversion layer is formed in the region b shown in FIG. 11 is $V_{tP}$. In the CMOS device of the present embodiment, $V_{tN}$ and $V_{tP}$ are controlled by the impurity concentrations of the impurity diffusion layers 164 and 165 to meet $V_{tN} - V_{tP} > V_{cc} - V_{ss}$. Thus, when a potential $V_{sP}$ which meets $V_{tN} > V_{sP} - V_{ss} > V_{tP} + V_{cc} - V_{ss}$ is applied to the shield plate electrode 122 of the field shield element-insolation structure, no parasitic MOS transistor in any region conducts.

Specifically, when the power supply voltage $V_{cc}=3.3$ (V), $V_{tN}$ and $V_{tP}$ are controlled to meet $V_{tN} > 2$ (V) and $V_{tP} < -2$ (V) and ½ $V_{cc}=1.65$ (V) is applied to the shield plate electrode 122 as $V_{sP}$, the potential of the shield plate electrode 122 measured with respect to the source potential ($V_{ss}$) of the NMOS transistor 151 is $1.65-0=1.65$ (V), which is lower than $V_{tN}$, so that no inversion layer is formed in the region a below the shield plate electrode 122. On the other hand, when $V_{cc}=1.65$ (V) is applied to the shield plate electrode 122 as $V_{sP}$, the potential of the shield plate electrode 122 measured with respect to the source potential ($V_{cc}$) of the PMOS transistor 152 is 1.65−3.3=−1.65 (V), which is larger than $V_{tP}$, so that no inversion layer is formed in the region b below the shield plate electrode 122.

In this manner, in the present embodiment, the ion implantation is conducted to the regions a and b below the shield plate electrode 122 to form the impurity diffusion layers 164 in order to set $V_{tN}$ and $V_{tP}$ to meet $V_{tN}−V_{tP}>V_{cc}−V_{ss}$, and the potential $V_{sP}$ which meets $V_{tN}>V_{sP}−V_{ss}>V_{tP}+V_{cc}−V_{ss}$ is applied to the shield plate electrode 122 so that no inversion layer is formed in any of the regions a and b below the shield plate electrode 122. Accordingly, a sufficient separation is attained only by the regions a and b below the shield plate electrode 122 without increasing the width from the right end of each of the source/drains 105 and 106 of the NMOS transistor 151 to the right end of the impurity diffusion layer 153 and the width from the left end of each of the source/drains 108 and 109 of the PMOS transistor 152 to the left end of the impurity diffusion layer 154, and the separation width may be narrower than that of the prior art and a higher integration density is attained.

In the second to fourth embodiments, the potentials of the three shield plate electrodes 122, 123 and 124 are set to different potentials with respect to each other. Alternatively, by controlling the impurity concentrations of the wells 102 and 103, the potentials of the three shield plate electrodes 122, 123 and 124 may be set to the same potential like the first embodiment. In this case, the three shield plate electrodes 122, 123 and 124 may be continued.

In accordance with the semiconductor device of the present invention, the shield plate electrode of the field shield element-isolation structure in the N-channel region is made to the same potential as that of the P-channel region of the CMOS structure. Accordingly, the field shield element-isolation structures in those regions may be continuously formed and the field shield element-isolation structure in the CMOS device is simplified and the space for the field region is reduced.

Further, in accordance with the present invention, since $V_{tN}$ and $V_{tP}$ are controlled to meet $V_{tN}−V_{tP}>V_{cc}−V_{ss}$ and the potential $V_{sP}$ of the shield plate electrode is set to meet $V_{tN}>V_{sP}−V_{ss}>V_{tP}+V_{cc}−V_{ss}$, no inversion layer is formed in any region and the parasitic MOS transistor does not conduct. Accordingly, a sufficient separation is attained by only the regions below the shield plate electrode formed in the boundary area between the P well and the N well and the separation width is narrower than that of the prior art and a higher integration density is attained.

We claim:

1. A semiconductor device comprising:
   a semiconductor substrate having N- and P-channel regions formed therein, said N-channel region including an impurity of a first conductivity type and said P-channel region including an impurity of a second conductivity type different from said first conductivity type;
   at least one first transistor formed in said N-channel region and having a drain and a source;
   at least one second transistor formed in said P-channel region and having a drain and a source; and
   a field shield element-isolation structure having an insulation film formed on said semiconductor substrate and a single shield plate electrode formed on said insulation film, said field shield element-isolation structure being formed on said semiconductor substrate at a boundary region between said P- and N-channel regions for isolating said first and second transistors from each other;
   wherein said P-channel region has a first area disposed just below said field shield element-isolation structure and a second area other than said first area, said first area including the impurity of said second conductivity type at an impurity concentration higher than an impurity concentration in said second area, so that said element-isolation structure is in direct contact with said first area of said P-channel region and in direct contact with an area of said N-channel region including the impurity of said first conductivity type.

2. A semiconductor device according to claim 1, wherein when a potential of said source of said first transistor is a first reference potential $V_{SS}$ and a potential of said source of said second transistor is a second reference potential $V_{CC}$ larger than $V_{SS}$, respective values of a first potential $V_{tN}$ of said shield plate electrode relative to said first reference potential $V_{SS}$ when an inversion layer is formed in an area of said N-channel region just below said shield plate electrode, and a second potential $V_{tP}$ of said shield plate electrode relative to said second reference potential $V_{CC}$ when an inversion layer is formed in said first area of said P-channel region are determined so as to meet:

$$V_{tN}-V_{tP}>V_{CC}-V_{SS}$$

and a potential $V_{SP}$ of said shield plate electrode is determined by using the above-mentioned values of $V_{tP}$ and $V_{tN}$ so as to meet;

$$V_{tN}>V_{SP}-V_{SS}>V_{tP}+V_{CC}-V_{SS}.$$

3. A semiconductor device according to claim 2, wherein said N-channel region has said impurity concentration determined by first potential $V_{tN}$ and said second area of said P-channel region has said impurity concentration determined by said second potential $V_{tP}$.

4. A semi conductor device according to claim 1, wherein said first transistor is an NMOS transistor and said second transistor is a PMOS transistor.

5. A semiconductor device comprising:
   a semiconductor substrate having N- and P-channel regions formed therein, said N-channel region including an impurity of a first conductivity type and said P-channel region including an impurity of a second conductivity type different from said first conductivity type;
   at least one first transistor formed in said N-channel region and having a drain and a source;
   at least one second transistor formed in said P-channel region and having a drain and a source; and
   a field shield element-isolation structure having an insulation film formed on said semiconductor substrate and a single shield plate electrode formed on said insulation film, said field shield element-isolation structure being formed on said semiconductor substrate at a boundary region between said P- and N-channel regions for isolating said first and second transistors from each other;
   wherein said N-channel region has a first area disposed just below said field shield element-isolation structure and a second area other than said first area, said first area including the impurity of said first conductivity type at an impurity concentration higher than an impurity concentration in said second area, and said P-channel region has a third area disposed just below said field shield element-isolation structure and a fourth area other than said third area, said third area including the impurity of said second conductivity type at an impurity concentration higher than an impurity concentration in said fourth area, so that said field shield element-isolation structure is in direct contact with said first area of said N-channel region including the impurity of said first conductivity type at the higher impurity concentration and in direct contact with said third area of said P-channel region including the impurity of said second conductivity type at the higher impurity concentration.

6. A semiconductor device according to claim 5, wherein when a potential of said source of said first transistor is a first reference potential $V_{SS}$ and a potential of said source of said second transistor is a second reference potential $V_{CC}$ larger than $V_{SS}$, respective values of a first potential $V_{tN}$ of said shield plate electrode relative to said first reference potential $V_{SS}$ when an inversion layer is formed in said first area of said N-channel region, and a second potential $V_{tP}$ of said shield plate electrode relative to said second reference potential $V_{CC}$ when an inversion layer is formed in said third area of said P-channel region are determined so as to meet:

$$V_{tN} - V_{tP} > V_{CC} - V_{SS}$$

and a potential $V_{SP}$ of said shield plate electrode is determined by using the above-mentioned values of $V_{tP}$ and $V_{tN}$ so as to meet;

$$V_{tN} > V_{SP} - V_{SS} > V_{tP} + V_{CC} - V_{SS}.$$

7. A semiconductor device according to claim 6, wherein said second area of said N-channel region has a said impurity concentration determined by said first potential $V_{tN}$ and said fourth area of said P-channel region has said impurity concentration determined by said second potential $V_{tP}$.

8. A semiconductor device according to claim 5, wherein said first transistor is an NMOS transistor and said second transistor is a PMOS transistor.

9. A semiconductor device comprising:

a semiconductor substrate having N- and P-channel regions formed therein, said N-channel region including an impurity of a first conductivity type and said P-channel region including an impurity of a second conductivity type different from said first conductivity type;

a plurality of first transistors formed in said N-channel region and each having a drain and a source;

a first field shield element-isolation structure having a first shield plate electrode and formed in said N-channel region for isolating said first transistors from each other;

a plurality of second transistors formed in said P-channel region and each having a drain and a source;

a second field shield element-isolation structure having a second shield plate electrode and formed in said P-channel region for isolating said second transistors from each other; and a third field shield element-isolation structure having an insulation film formed on said semiconductor substrate and a single third shield plate electrode formed on said insulation film, said third field shield element-isolation structure being formed on said semiconductor substrate at a boundary region between said P- and N-channel regions for isolating said first transistors from said second transistors;

wherein said first, second and third shield plate electrodes are formed in a continuous layer, said N-channel region has a first area disposed just below said third shield plate electrode and a second area other than said first area, said first area includes the impurity of said first conductivity type at an impurity concentration higher than an impurity concentration in said second area, said P-channel region has a third area disposed just below said third shield plate electrode and a fourth area other than said third area, said third area including the impurity of said second conductivity type at an impurity concentration higher than an impurity concentration in said fourth area, so that said third field shield element-isolation structure is in direct contact with said first area of said N-channel region including the impurity of said first conductivity type at the higher impurity concentration and in direct contact with said third area of said P-channel region including the impurity of said second conductivity type at the higher impurity concentration.

10. A semiconductor device according to claim 9, wherein when a potential of said source of one of said first transistors is a first reference potential $V_{SS}$ and a potential of said source of one of said second transistors, which is complementary with respect to said one of said first transistors, is a second reference potential $V_{CC}$ larger than $V_{SS}$, respective values of a first potential $V_{tN}$ of said shield plate electrode relative to said first reference potential $V_{SS}$ when an inversion layer is formed in said first area of said N-channel region, and a second potential $V_{tP}$ of said shield plate electrode relative to said second reference potential $V_{CC}$ when an inversion layer is formed in said third area of said P-channel region are determined so as to meet:

$$V_{tN} - V_{tP} > V_{CC} - V_{SS}$$

and a potential $V_{SP}$ of said shield plate electrode is determined by using the above-mentioned values of $V_{tP}$ and $V_{tN}$ so as to meet;

$$V_{tN} > V_{SP} - V_{SS} > V_{tP} + V_{CC} - V_{SS}.$$

* * * * *